(12) United States Patent
Hsieh

(10) Patent No.: US 12,268,017 B2
(45) Date of Patent: Apr. 1, 2025

(54) SHIELDED GATE TRENCH MOSFETS WITH IMPROVED TRENCH TERMINATIONS AND SHIELDED GATE TRENCH CONTACTS

(71) Applicant: NAMI MOS CO., LTD., New Taipei (TW)

(72) Inventor: Fu-Yuan Hsieh, New Taipei (TW)

(73) Assignee: NAMI MOS CO., LTD., New Taipei (TW)

(*) Notice: Subject to any disclaimer, the term of this patent is extended or adjusted under 35 U.S.C. 154(b) by 440 days.

(21) Appl. No.: 17/837,502

(22) Filed: Jun. 10, 2022

(65) Prior Publication Data
US 2023/0343867 A1  Oct. 26, 2023

Related U.S. Application Data

(63) Continuation-in-part of application No. 17/729,460, filed on Apr. 26, 2022.

(51) Int. Cl.
| | |
|---|---|
| H10D 30/66 | (2025.01) |
| H10D 62/10 | (2025.01) |
| H10D 62/17 | (2025.01) |
| H10D 64/00 | (2025.01) |

(52) U.S. Cl.
CPC ......... H10D 30/665 (2025.01); H10D 30/668 (2025.01); H10D 62/112 (2025.01); H10D 62/393 (2025.01); H10D 64/117 (2025.01)

(58) Field of Classification Search
None
See application file for complete search history.

(56) References Cited

U.S. PATENT DOCUMENTS

| | | | |
|---|---|---|---|
| 7,768,064 B2 | 8/2010 | Sapp et al. | |
| 2015/0108569 A1* | 4/2015 | Grivna | H10D 30/665 |
| | | | 257/334 |
| 2015/0206937 A1* | 7/2015 | Yedinak | H01L 29/8725 |
| | | | 257/334 |
| 2023/0343866 A1* | 10/2023 | Hsieh | H01L 29/7811 |

* cited by examiner

*Primary Examiner* — Nduka E Ojeh
(74) *Attorney, Agent, or Firm* — BACON & THOMAS, PLLC

(57) ABSTRACT

Shielded gate trench MOSFETs with gate trenches separated from termination trenches are disclosed, wherein at least one termination trench surrounds outer periphery of gate trenches and does not surround the gate metal pad area. The shielded gate electrode inside each of the gate trenches is connected to a source metal through at least one shielded gate trench contact which is spaced apart from at least one gate metal runner with a distance larger than 100 um. A breakdown voltage enhancement region and an avalanche capability enhancement region in the device structures are also disclosed.

20 Claims, 22 Drawing Sheets

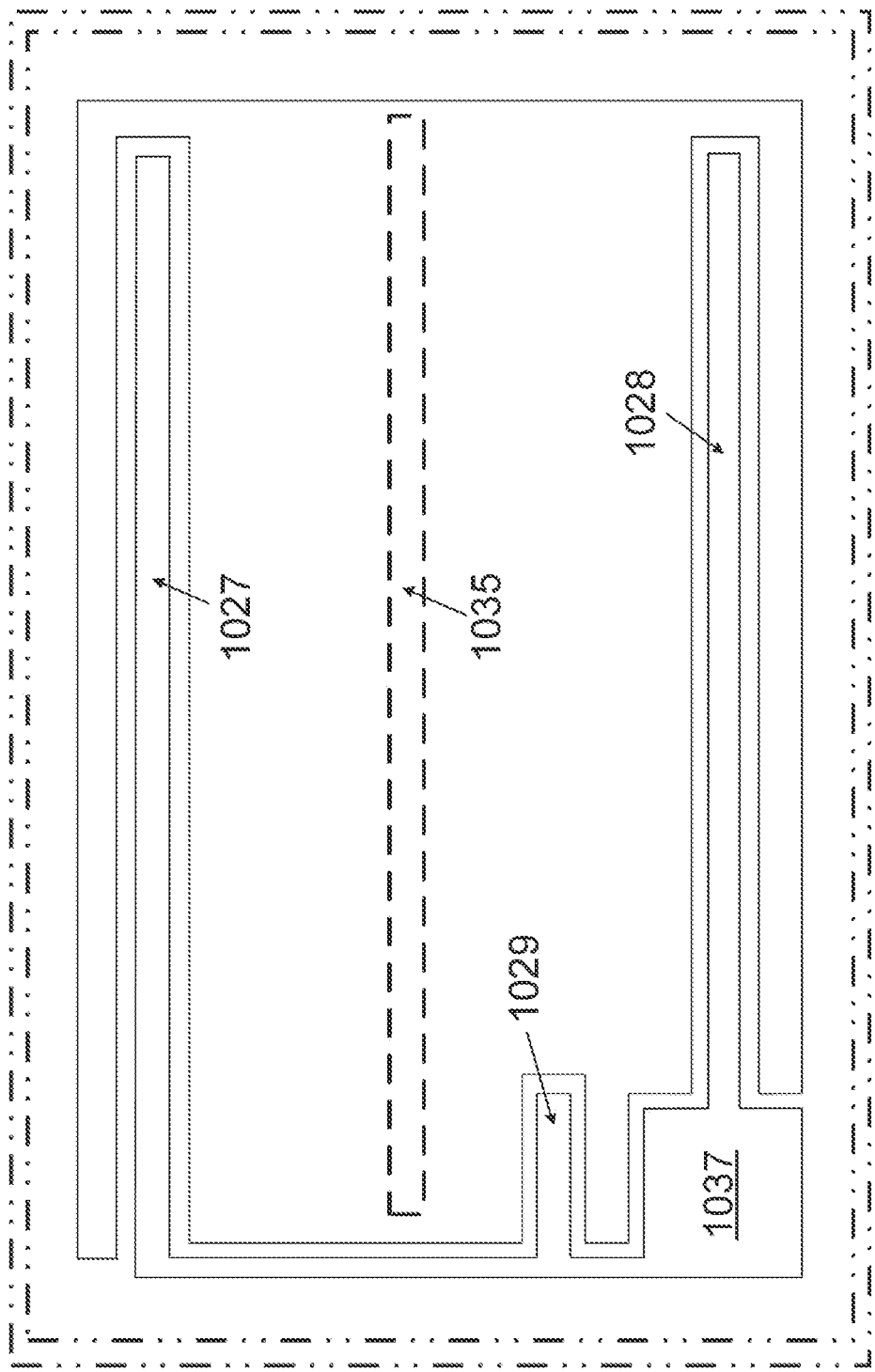

SHIELDED GATE TRENCH MOSFETS WITH IMPROVED TRENCH TERMINATIONS AND SHIELDED GATE TRENCH CONTACTS

CROSS-REFERENCE TO RELATED APPLICATION

This application is a Continuation-in-Part of U.S. patent application Ser. No. 17/729,460 of the same inventor, filed on, Apr. 27, 2022 entitled "shielded gate trench MOSFETs with improved trench terminations and shielded gate trench contacts".

FIELD OF THE INVENTION

This invention relates generally to a shielded gate trench (SGT) MOSFET (Metal Oxide Semiconductor Field Effect Transistor) having at least one termination trench surrounding outer periphery of gate trenches in an active area and not surrounding the gate metal pad area; and a shielded gate electrode inside each of the gate trenches connected to a source metal through at least one shielded gate trench contact which is spaced apart from at least one gate metal runner with an optimized distance for high frequency applications.

BACKGROUND OF THE INVENTION

For high-frequency applications, shielded gate resistance Rs plays an important role on reverse recovery time Trr of a parasitic body diode and switching voltage Vsw of drain-source. The higher the shielded gate resistance Rs, the lower the Trr and Vsw. However, if Rs is too high, breakdown voltage becomes unstable. An optimized Rs is needed to be found.

FIG. 1A shows a shielded gate trench MOSFET 100 disclosed in prior art U.S. Pat. No. 7,768,064 comprising a resistive element 101 between shielded electrode 102 and source metal for reduction of the reverse recovery charge Qrr of a parasitic body diode in the shielded gate trench MOSFET 100. Besides, the shielded gate trench MOSFET 100 further comprises: a planar source-body contact to contact n+ source region 103 and P body region 104 with the source metal 105; and a p+ ohmic body contact doped region 106 to reduce the contact resistance between the source metal 105 and the P body region 104.

From FIG. 1B which is a top view of the shielded gate trench MOSFET 100 shown in FIG. 1A, it can be seen that, the resistive element 101 (illustrated by dash lines) is placed between end contacts 106 and 107, wherein the end contact 106 is connected to the shielded electrode 102 (as shown in FIG. 1A) while the end contact 107 is connected to the source metal 105. However, the implementation of the resistive element 101 will need additional cost such as additional mask for a poly-silicon resistor.

Therefore, there is still a need to provide new device configurations such that above discussed problems and limitations can be resolved.

SUMMARY OF THE INVENTION

The present invention provides new SGT MOSFETs with improved trench termination and gate trenches being separated from termination trenches, wherein at least one termination trenches surrounds outer periphery of the gate trenches and do not surround the gate metal pad area; The shielded gate electrode inside each of the gate trenches is connected to a source metal through at least one shielded gate trench contact which is spaced apart from at least one gate metal runner with an optimum distance for high frequency applications.

The specific on-resistance can be further reduced with combination of the multiple stepped epitaxial (MSE) structure and multiple stepped oxide (MSO) structure. The MSO structure is a field plate oxide surrounding a shielded gate electrode in a gate trench having multiple stepped oxide with varying thickness decreasing stepwise in a direction from a bottom of the gate trench to a body region, wherein each stepped oxide has a uniform thickness.

According to one aspect, the invention features a SGT device comprising: an active area, a termination area, a gate metal pad area, a central gate metal runner and at least one shielded gate trench contact row area; the active area comprises a plurality of gate trenches formed in an epitaxial layer of a first conductivity type onto a substrate of the first conductivity type along a first axis including a first type active trench having a first trench length, and a second type active trench near the gate pad area having a second trench length, wherein the first type active trench length is longer than the second type active trench length; the termination area comprises at least one first termination trench surrounding outer periphery of the plurality of gate trenches in a first direction along the first axis and in a second direction along a second axis wherein the first axis is vertical to the second axis, and at least one first type termination trench is separated from the plurality of gate trenches and does not surround the gate pad area; and the SGT device further comprising: plurality of gate trenches formed in the active area, surrounded by a first type source regions of a first conductivity type are encompassed in a first type body regions of a second conductivity type near a top surface of an epitaxial layer of the first conductivity type, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an (Inter-Poly Oxide) IPO film, the gate oxide surrounds the gate electrode and has less thickness than the first insulating film; the gate electrode inside each of the gate trenches is connected to the gate metal pad through the central gate metal runner having a plurality of gate trench contacts underneath; the shielded gate electrode inside each of the gate trenches is connected to a source metal through at least one shielded gate trench contact on each of the plurality of gate trenches, at least one shielded gate trench contact locates in at least one shielded gate contact row area along the second axis, and at least one shield gate trench contact is spaced apart from the gate metal runner with a distance larger than 100 μm, and the central gate metal is disposed in the vicinity of the middle of the source metal.

According to another aspect, in some preferred embodiments, a shielded gate spreading resistance replaces the resistive element in the prior art U.S. Pat. No. 7,768,064 by disposition of shielded gate trench contacts in a region spaced apart from the gate metal runner with an optimized distance. Therefore, no additional cost will be added and no any drawbacks are introduced.

According to another aspect, in some preferred embodiments, the epitaxial layer is a single epitaxial layer with a uniform doping concentration. In some other preferred embodiments, the epitaxial layer has MSE layers with different doping concentrations decreasing stepwise in a direction from bottoms of the plurality of gate trenches toward the first type body regions along sidewalls of the gate trenches.

According to another aspect, in some preferred embodiments, the SGT device further comprises a channel stop region in the termination area with a second type source region of the first conductivity type shorted with the epitaxial layer underneath a channel stop metal, and none of the first type body regions exists between two adjacent termination trenches.

According to another aspect, in some preferred embodiments, the gate electrode is disposed above the shielded gate electrode inside each of the plurality of gate trenches. In some other preferred embodiments, the shielded electrode is disposed in the middle of each of the plurality of gate trenches and the gate electrode is disposed surrounding upper portion of the shielded electrode.

According to another aspect, in some preferred embodiments, the first insulating film is a single oxide film having a uniform thickness. In some other preferred embodiments, the first insulating film has MSO structure with thickness decreasing stepwise in a direction from bottoms of the gate trenches toward the body regions along sidewalls of the gate trenches.

According to another aspect, in some preferred embodiments, the SGT device further comprises two long shielded gate trench contact row areas in a top and a bottom of the source metal and one short shielded gate trench contact row area above the gate metal pad area wherein each of the plurality of gate trenches has two shielded gate trench contacts.

According to another aspect, in some preferred embodiments, the SGT device further comprises one long shielded gate trench contact row area in a top of the source metal wherein each of the plurality of gate trenches has one shielded gate trench contact.

According to another aspect, in sonic preferred embodiments, the SGT device further comprises one long shielded gate trench contact row area in a bottom of the source metal and one short shielded gate trench contact row area above the gate metal pad area wherein each of the plurality of gate trenches has one shielded gate trench contact.

According to another aspect, the present invention also features a SGT device comprising: an active area, a termination area, a gate metal pad area, multiple gate metal runners and a central shielded gate trench contact row area; the active area comprises a plurality of gate trenches formed in an epitaxial layer of a first conductivity type onto a substrate of the first conductivity type along a first axis including a first type active trench having a first trench length, and a second type active trench near the gate pad area having a second trench length, wherein the first type active trench length is longer than the second type active trench length; the termination area comprises at least one first type termination trench surrounding outer periphery of the gate trenches in a first direction along the first axis and in a second direction along a second axis wherein the first axis is vertical to the second axis, and at least one first type termination trench is separated from the plurality of gate trenches and does not surround the gate metal pad area; the gate electrode inside each of the gate trenches is connected to the gate metal pad through the multiple gate metal runners having a plurality of gate trench contacts underneath; the shielded gate electrode inside each of the plurality of gate trenches is connected to a source metal through at least one shielded gate trench contact; the multiple gate metal runners including a top and a bottom long gate metal runners, and a short gate metal runner is above the gate metal pad along the second axis; the central shielded gate contact row area locates in the vicinity of a center of the source metal along the second axis; the shielded gate electrode inside each of the gate trenches is connected to a source metal through a shielded gate trench contact on each of the plurality of gate trenches in the central shielded gate contact row area, and the shield gate trench contact is spaced apart from each of the multiple gate metal runners with a distance larger than 100 μm.

According to another aspect, the present invention also features a SGT device comprising: an active area, a termination area, a gate metal pad area and multiple gate metal runners; the active area comprises a plurality of gate trenches formed in an epitaxial layer of a first conductivity type onto a substrate of the first conductivity type; the gate electrode inside each of the gate trenches is connected to the gate metal pad through the multiple gate metal runners having a plurality of gate trench contacts underneath; the shielded gate electrode inside each of the gate trenches is connected to a source metal through at least one shielded gate trench contact which is spaced apart from any of the multiple gate metal runners with a minimum distance larger than 100 μm.

According to another aspect, in some preferred embodiments, the multiple gate metal runners have one long gate metal runner disposed in the middle region of the active area, and two short gate metal runners disposed above and below the gate metal pad area, respectively. In some other preferred embodiments, the multiple gate metal runners have three long gate metal runners disposed in top, middle and bottom regions of the active area, and two short gate metal runners disposed above and below the gate metal pad area, respectively.

According to another aspect, in some preferred embodiments, the SGT device further comprises two shielded gate trench contact row regions in a top and a bottom of the source metal wherein each of the plurality of gate trenches has at least one shielded gate trench contact. In some other preferred embodiments, the SGT device further comprises two shielded gate trench contact row areas among the multiple gate metal runners wherein each of the plurality of gate trenches has at least one shielded gate trench contact.

According to another aspect, in some preferred embodiments, a shielded gate resistance of the shielded gate electrode is between 0.2 ohm and 2.0 ohm.

According to another aspect, in some preferred embodiments, the SGT device further comprises a source breakdown voltage holding region adjoining lower surfaces of body regions and being spaced apart from adjacent plurality of gate trenches to avoid avalanche breakdown occurrence near a channel region. A parasitic bipolar transistor (n+/p/N) existing in the channel region is easily turned on resulting in device failure at lower avalanche energy ratings. As the source breakdown voltage holding region has a breakdown voltage lower than the parasitic bipolar transistor, avalanche current would flow to the source metal directly through the source breakdown voltage holding region without turning on the parasitic bipolar transistor. The avalanche capability of the device with the source breakdown voltage holding region is thus enhanced.

According to another aspect, in some preferred embodiments, the SGT device further comprises an electric field reducing region surrounding each bottom of plurality of gate trenches with a doping concentration lower than the first epitaxial layer of multiple stepped epitaxial layers for breakdown voltage enhancement. The purpose of installation of the electric field reducing region into the SGT device is to solve breakdown voltage degradation as a field oxide thickness at each bottom of the plurality of gate trenches is less than that at sidewalls.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description to explain the principles of the invention. In the drawings:

FIG. 10A is a simplified top view showing, another preferred embodiment for a SGT MOSFET according to the present invention.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used fin purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
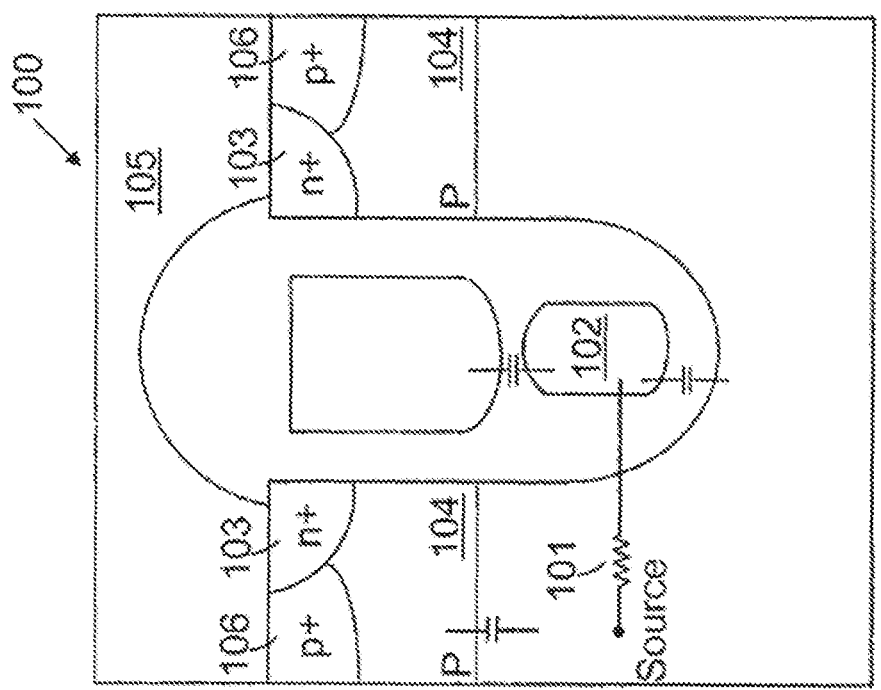
FIG. 1A is a cross-sectional view of a SGT MOSFET of prior art.
Figure 1B:
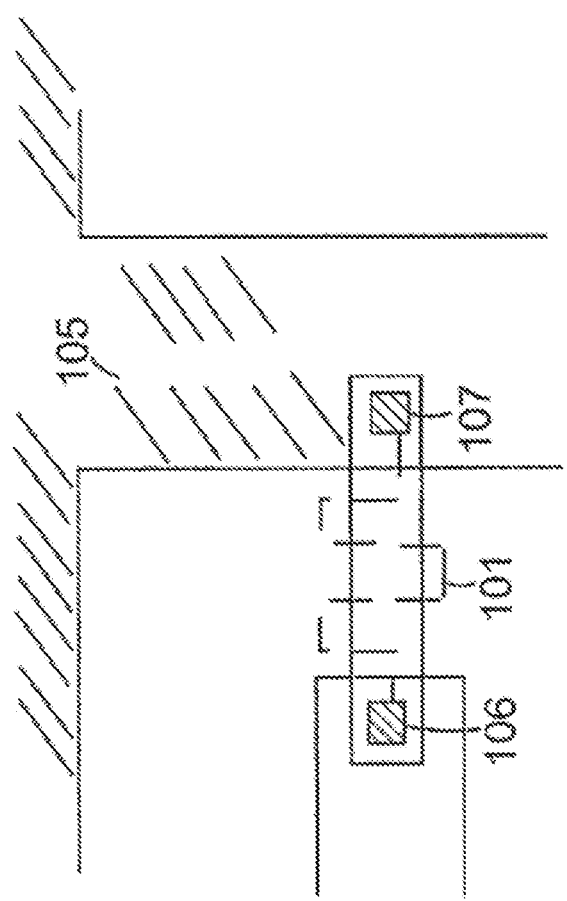
FIG. 1B is a top view of the SGT MOSFET shown in FIG. 1A.
Figure 2A:
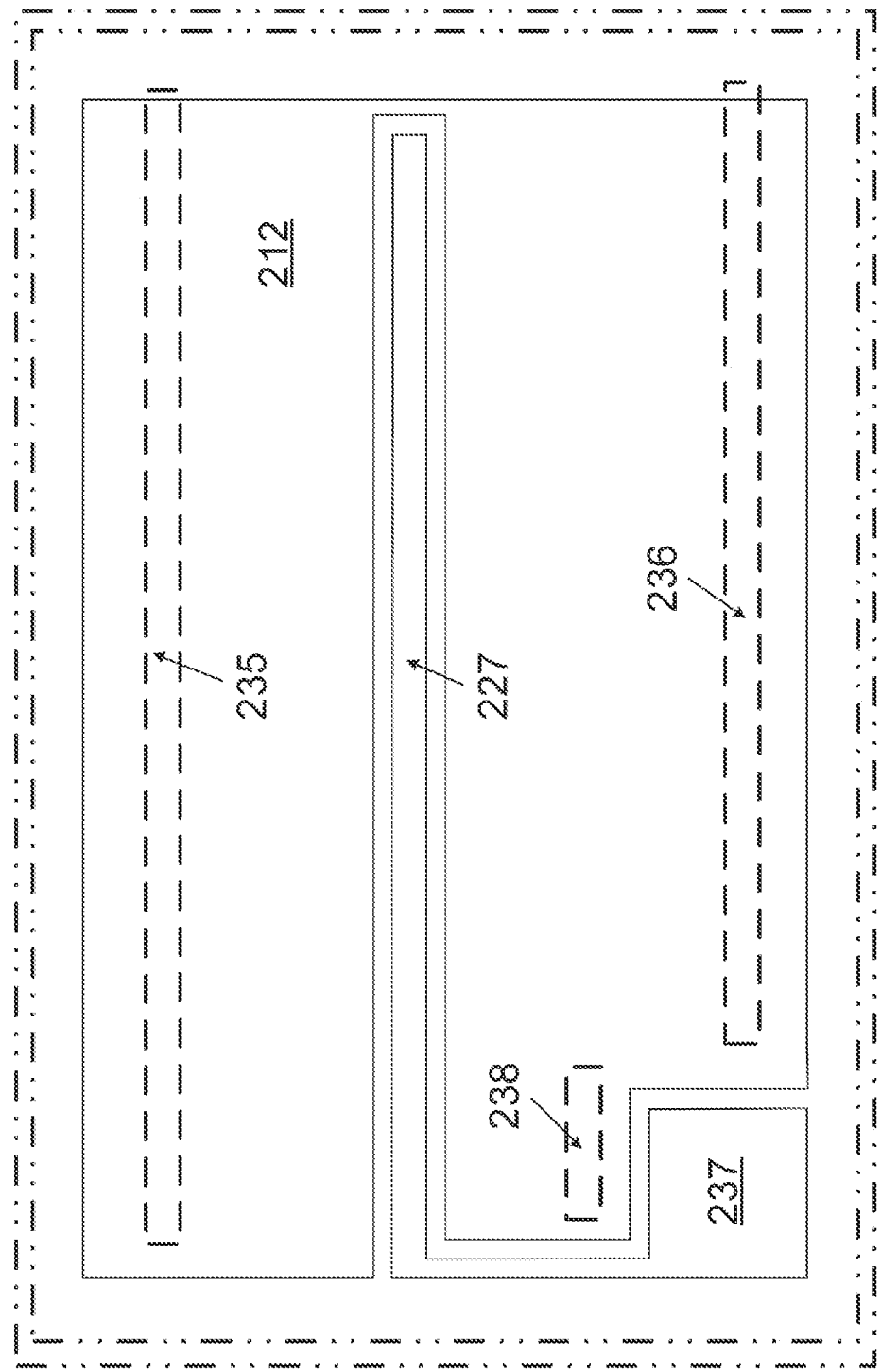
FIG. 2A is a simplified top view of a preferred embodiment for a SGT MOSFET according to the present invention.

Please refer to FIG. 2A for a simplified top view of a preferred embodiment for a SGT semiconductor power device according to the present invention. The SGT semiconductor power device comprises an active area, a termination area, a gate metal pad area 237, a central gate metal runner 227 located in the vicinity of the middle of the source metal 212, a top long shielded gate trench contact row area 235, a bottom long shielded gate trench contact row area 236 and a short shielded gate trench contact row area 238 above the gate metal pad area.

Figure 2B:
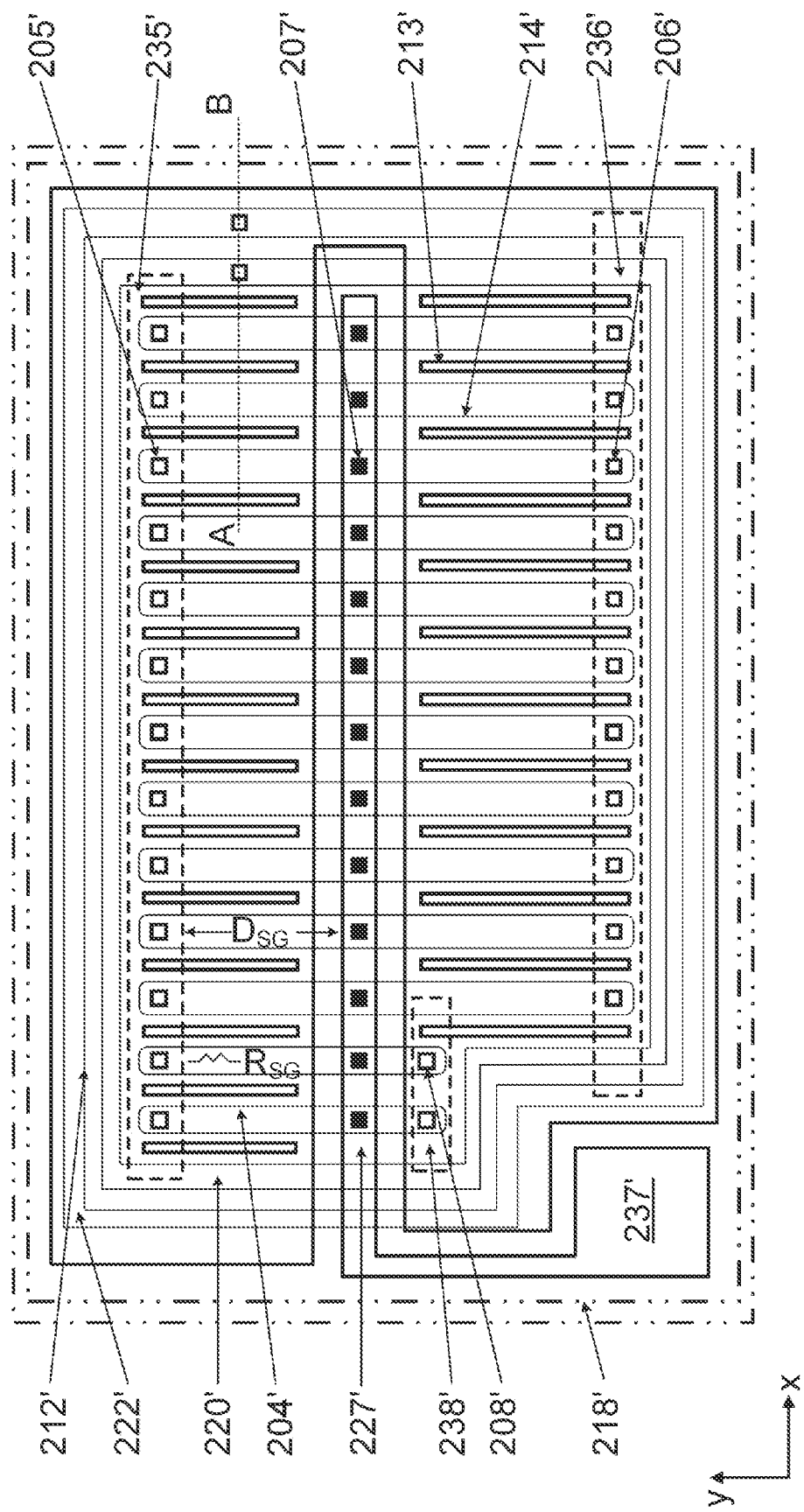
FIG. 2B is a detailed top view of the preferred embodiment for a SGT MOSFET of FIG. 2A according to the present invention.

Please refer to FIG. 2B for a detailed top view of the preferred embodiment for a SGT MOSFET of FIG. 2A according to the present invention, wherein the SGT semiconductor power device comprises an active area, a termination area, a gate metal pad area 237', a central gate metal Milner 227' located in the vicinity of the middle of the source metal 212' having a plurality of gate trench contacts 207' underneath, a top long shielded gate trench contact row area 235', a bottom long shielded gate trench contact row area 236' and a short shielded gate trench contact row area 238' above the gate metal pad area. In the active area, a plurality of the first type active trenches 214' and the second type active trenches 204' are formed in an N type epitaxial layer onto a N+ substrate along a first axis direction (the y reference direction), wherein the length of the first type active trench 214' is longer than that of the second type active trench 204'. On each of the first type active trenches 214', a top shielded gate trench contact 205' in a top long shielded gate trench contact row area 235' and a bottom shielded gate trench contact 206' in a bottom long shielded gate trench contact row area 236' are formed. On each of the first type active trenches 204', the top shielded gate trench contact 205' in the top long shielded gate trench contact row area 235' and a bottom shielded gate trench contact 208' in a short shielded gate trench contact row area 238' above the gate metal pad area are formed. The gate electrode inside each of the gate trenches is connected to the gate metal pad area 237' through the central gate metal runner 227' disposed in the vicinity of the middle of the source metal 212' having a plurality of gate trench contacts 207' and 209' underneath. The shielded gate electrode inside each of the gate trenches is connected to a source metal 212' through shielded gate trench contacts 205' and 206' located in the top and bottom shielded gate contact row area 235' and 236' along a second axis (the x reference axis). The top shielded gate trench contacts 205' locate in a region spaced apart from the central gate metal runner 227' with a distance ($D_{SG}$, as illustrated) larger than 100 μm. In the termination area, multiple termination trenches including the first termination trench 220' and the second termination trench 222' are formed surrounding outer periphery of the first type active gate trenches 214' and the second type active gate trenches 204' in a first direction along the first axis direction (the y reference direction) and in a second direction along a second axis direction (the x reference direction) wherein the first axis is vertical to the second axis, and the first termination trench 220' is separated from the gate trenches 214' and 204' and does not surround the gate metal pad area 237'. Besides, inner and outer edges of the first termination trench 220' and the second termination trench 222' have a straight shape. A channel stop metal 218 in the termination area is formed. Moreover, a shielded gate electrode inside each of the second type active trenches 204' is connected to the source metal 212' with a built-in shielded gate spreading resistance ($R_{SG}$, as illustrated) between the top shielded gate trench contact 205' and the central gate metal runner 227' ranging from 0.2 ohm to 2.0 ohm for reduction of the reverse recovery charge Qrr of a parasitic body diode and the switching voltage Vsw in the SGT device.

Figure 3A:
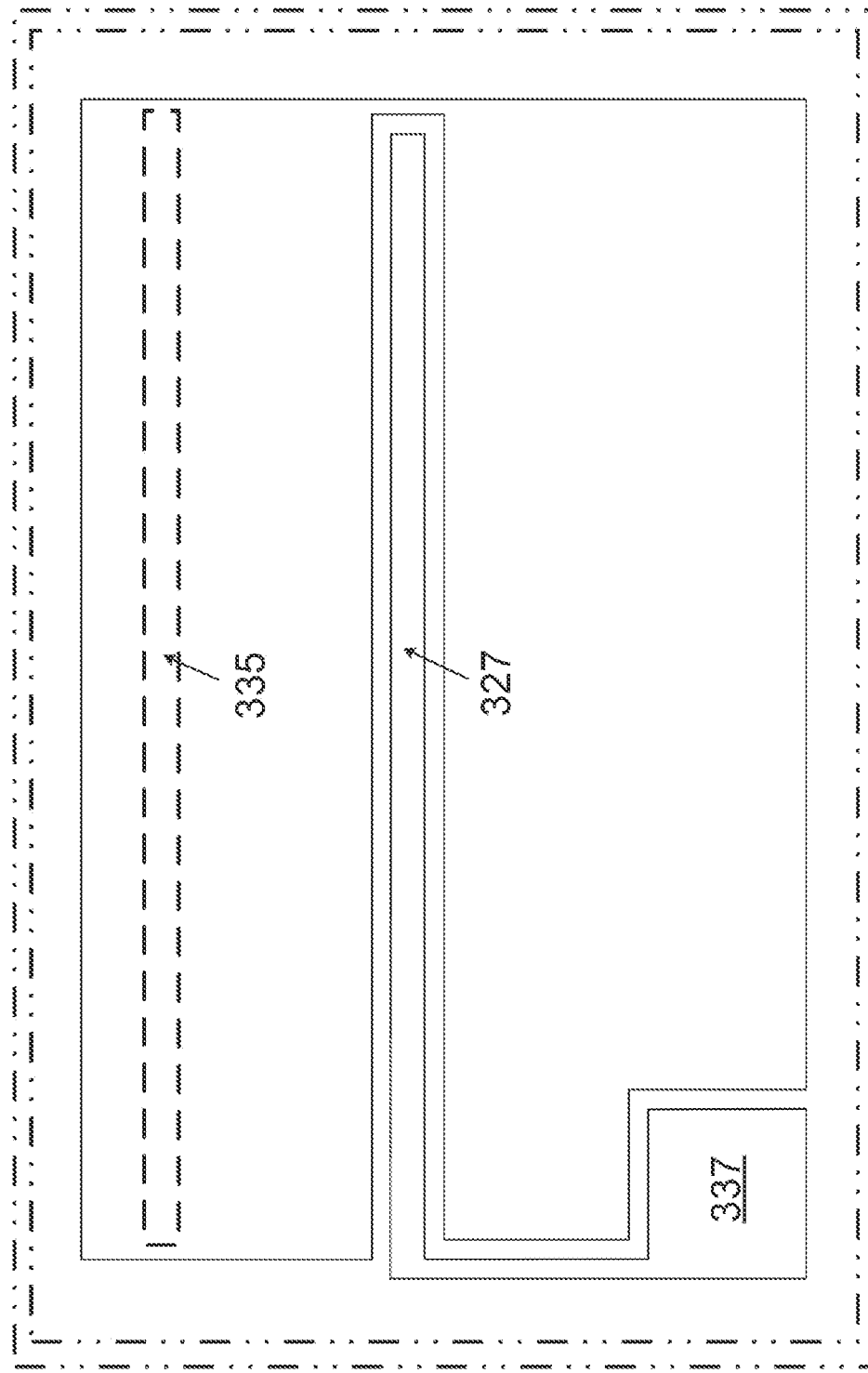
FIG. 3A is a simplified top view showing another preferred embodiment for a SGT MOSFET according to the present invention.

Please refer to FIG. 3A for a simplified top view of another preferred embodiment for a SGT semiconductor power device according to the present invention. The SGT semiconductor power device comprises an active area, a termination area, a gate metal pad area 337, a central gate metal runner 327, and a top long shielded gate trench contact row area 335.

Figure 3B:
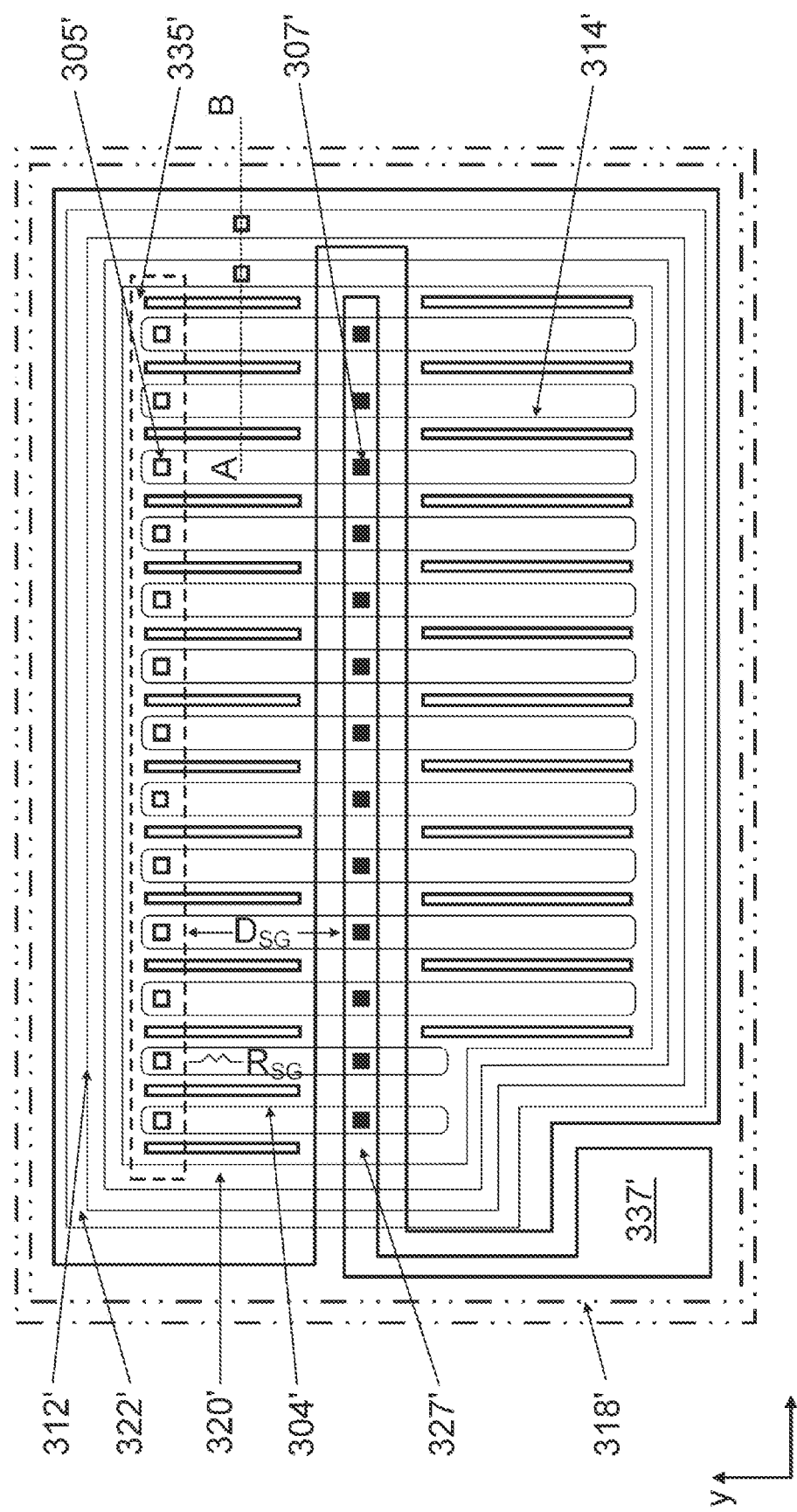
FIG. 3B is a detailed top view of the preferred embodiment for a SGT MOSFET of FIG. 3A according to the present invention.

Please refer to FIG. 3B for a detailed top view of the preferred embodiment for a SGT MOSFET of FIG. 3A according to the present invention, wherein the SGT semiconductor power device comprises an active area, a termination area, a gate metal pad area 337', a central gate metal runner 327' and a top long shielded gate trench contact row area 335'. The semiconductor power device has a similar structure to FIG. 2B, except that, in FIG. 3B, only one top shielded gate trench contact 305' and one gate trench contact 307' are formed in each of the first type active gate trenches 314' and the second type active gate trenches 304'. Besides, the shielded gate trench contacts 305' are spaced apart from the gate metal runners 327' disposed in the vicinity of the middle of the source metal 312' with a distance ($D_{SG}$, as illustrated) larger than 100 μm.

Figure 4A:
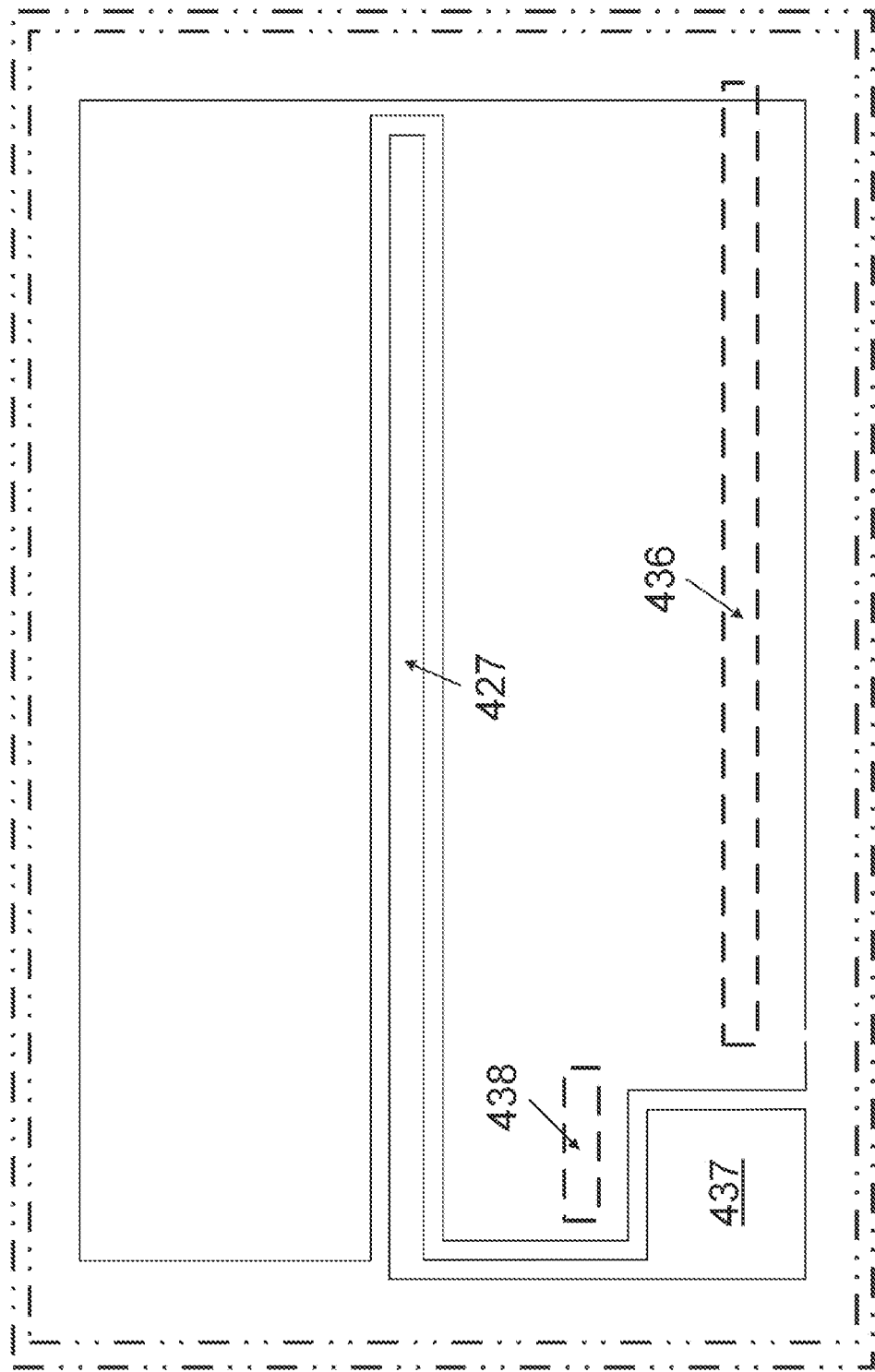
FIG. 4A is a simplified top view showing another preferred embodiment for a SGT MOSFET according to the present invention.

Please refer to FIG. 4A for a simplified top view of another preferred embodiment for a SGT semiconductor power device according to the present invention. The SGT semiconductor power device comprises an active area, a termination area, a gate metal pad area 437, a central gate metal runner 427, a bottom long shielded gate trench contact row area 436 and a short shielded gate trench contact row area 438 above the gate metal pad area.

Figure 4B:
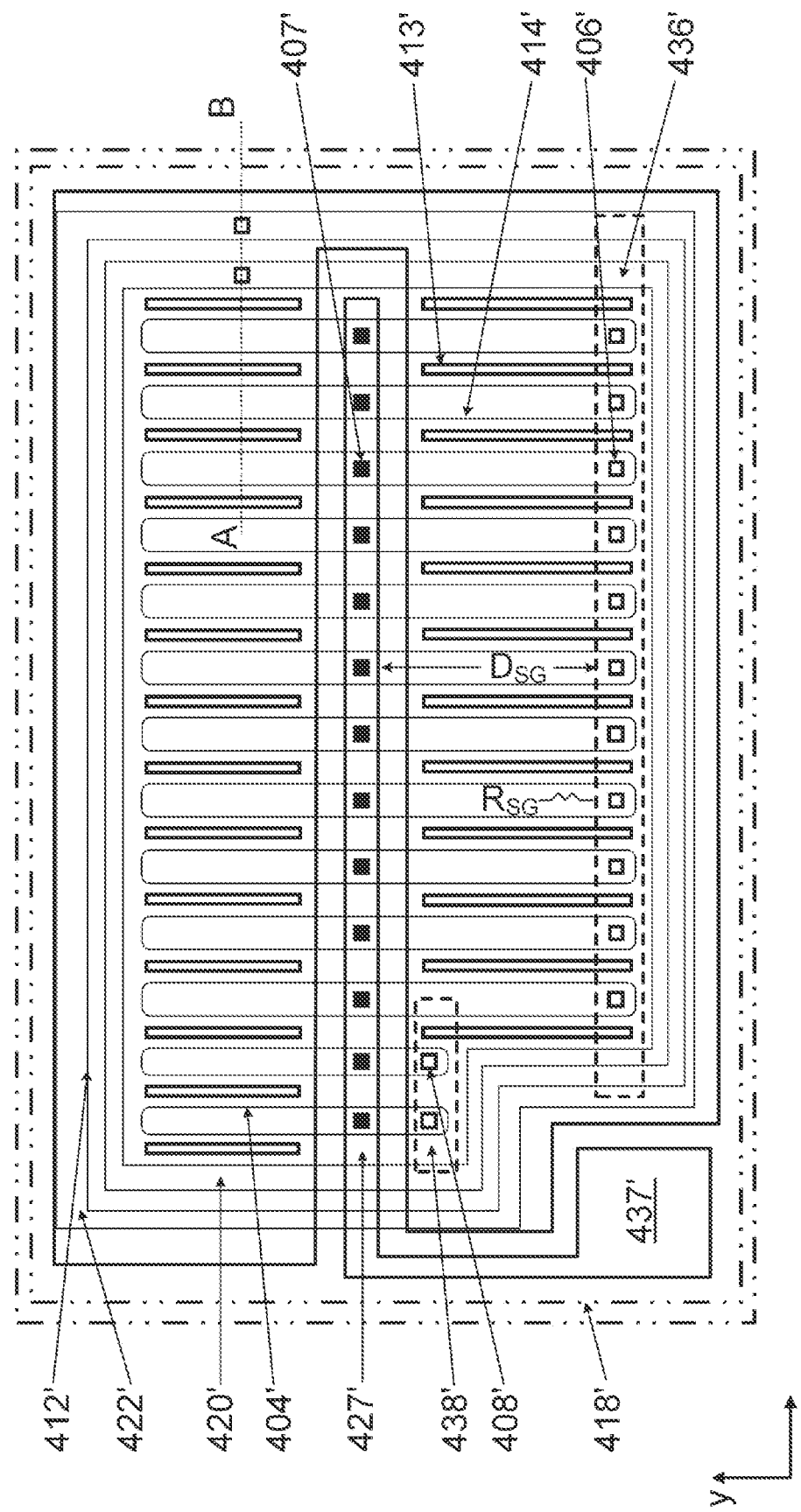
FIG. 4B is a detailed top view of the preferred embodiment for a SGT MOSFET of FIG. 4A according to the present invention.

Please refer to FIG. 4B for a detailed top view of the preferred embodiment for a SGT MOSFET of FIG. 4A according to the present invention, wherein the SGT semiconductor power device comprises an active area, a termination area, a gate metal pad area 437', a central gate metal runner 427', a bottom long shielded gate trench contact row area 436' and a short shielded gate trench contact row area 438' above the gate metal pad area. The semiconductor power device has a similar structure to FIG. 2B, except that, in FIG. 4B, only one bottom shielded gate trench contact 406' or 408' and one gate trench contact 407' in the middle of the source metal 412' are formed. The shielded gate trench contact 406' is spaced apart from the gate metal runners 427' with a distance ($D_{SG}$, as illustrated) higher than 100 μM.

Figure 5:
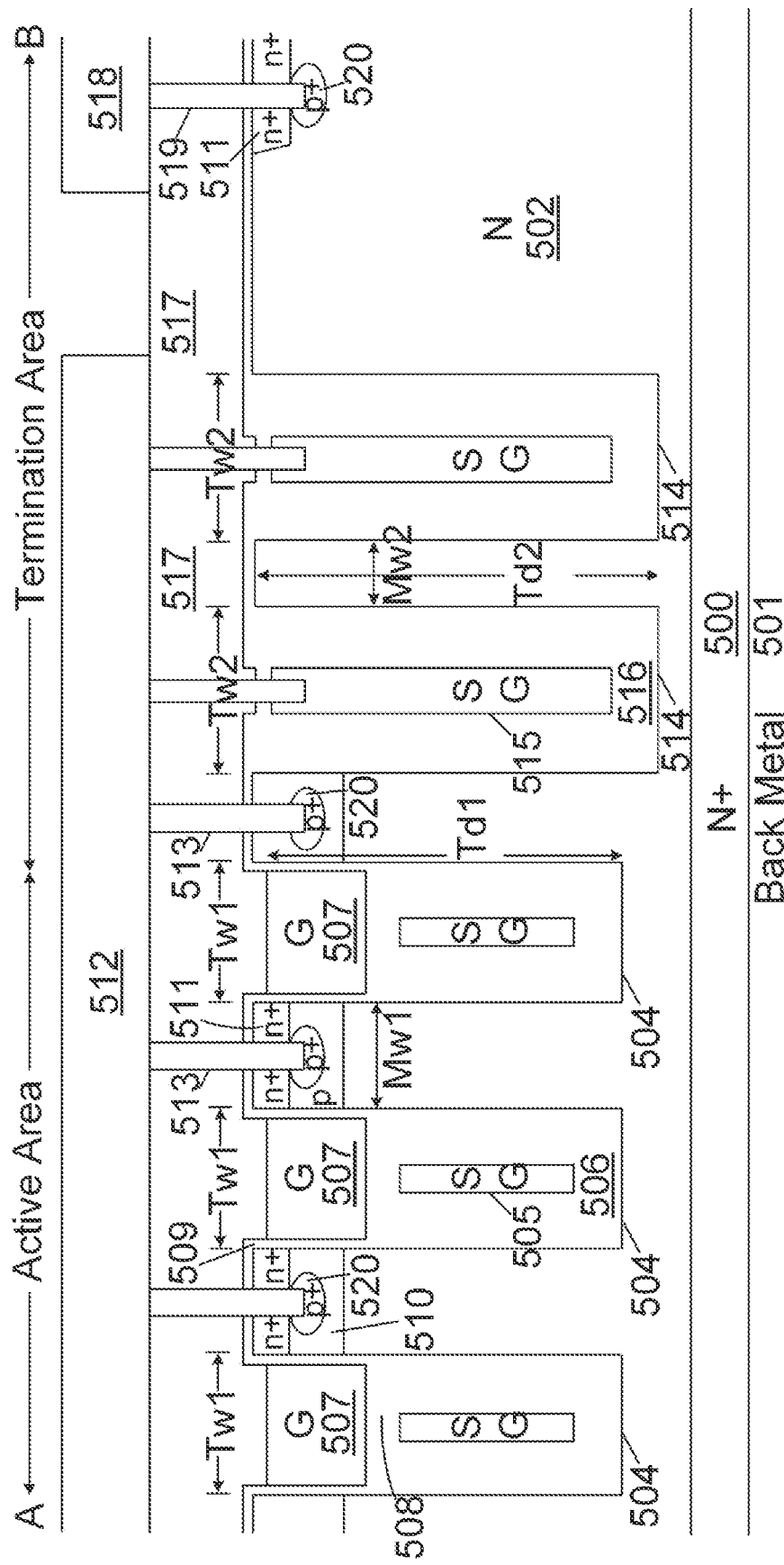
FIG. 5 is a cross-sectional view showing a preferred A-B cross section of FIG. 2B according to the present invention.

Please refer FIG. 5 for a preferred A-B cross-sectional view of FIG. 2B, wherein the preferred embodiment of this invention comprises an active area and a termination area with a single N type epitaxial layer 502 with a uniform doping concentration. The device comprises an N-channel SGT MOSFET formed in an N type epitaxial layer onto an N+ substrate 500 coated with a back metal 501 of Ti/Ni/Ag on rear side as a drain metal. Inside the N type epitaxial layer 502, a plurality of gate trenches 504 in an active area and edge trenches 514 in a termination area are formed extending from a top surface of the N epitaxial layer 502 and vertically downward and not reaching a common interface between the substrate 500 and the N epitaxial layer 502. Inside each of the gate trenches 504 in the active area, a shielded gate electrode (SG, as illustrated) 505 is disposed in the lower portion and a single gate electrode (G, as illustrated) 507 is disposed in the upper portion above the shielded gate electrode 505. The shielded gate electrode 505 is insulated from the adjacent epitaxial layer by a first insulating film 506, and the gate electrode 507 is insulated from the adjacent epitaxial layer by a gate oxide 509, wherein the gate oxide 509 has a thinner thickness than the first insulating film 506 which has a uniform thickness along trench sidewalk, meanwhile, the shielded gate electrode 505 and the gate electrode 507 is insulated from each other by an IPO film 508. Between every two adjacent gate trenches 504, the P body regions 510 with n+ source regions 511 thereon are extending near top surface of the N epitaxial layer 502. The P body regions 510, the n+ source regions 511 and the shielded gate electrodes 505 are further shorted together to a source metal 512 through a plurality of source trenched contacts 513 filled with contact plugs and barriers implemented by penetrating through a contact insulating layer 517 and extending into the P body regions 510. The source trenched contacts 513 are surrounded by p+ heavily doped regions 520 around bottoms underneath the n+ source regions 511. In the N epitaxial layer 502, outside the edge of the active area including the termination area, a p+ body contact doped region 520 is formed surrounding at least bottom of the trenched source-body contacts 513. The source regions 511 and the body regions 510 in the active area are not disposed between two adjacent of the edge trenches 514 in the termination area. Inside each of the edge trenches 514, a trench field plate 515 is disposed and insulated from the adjacent epitaxial layer by a second insulating film 516, wherein the trench width Tw2 of the edge trench 514 is greater than or equal to the trench width Tw1 of the gate trench 504 in the active area(Tw2≥Tw1), and the trench depth Td2 of the edge trench 514 is greater than or equal to the trench depth Td1 of the gate trench 504 in the active area(Td2≥Td1). The mesa width between two adjacent of the gate trenches 504 is equal to or larger than that between two adjacent of the edge trenches 514 (Mw1≥Mw2). Moreover, in the termination area, a channel stop metal 518 is connected with the n+ source region 511, the N epitaxial layer 502, and a p+ body contact doped region 520 through a trenched channel stop contact 519.

Figure 6:
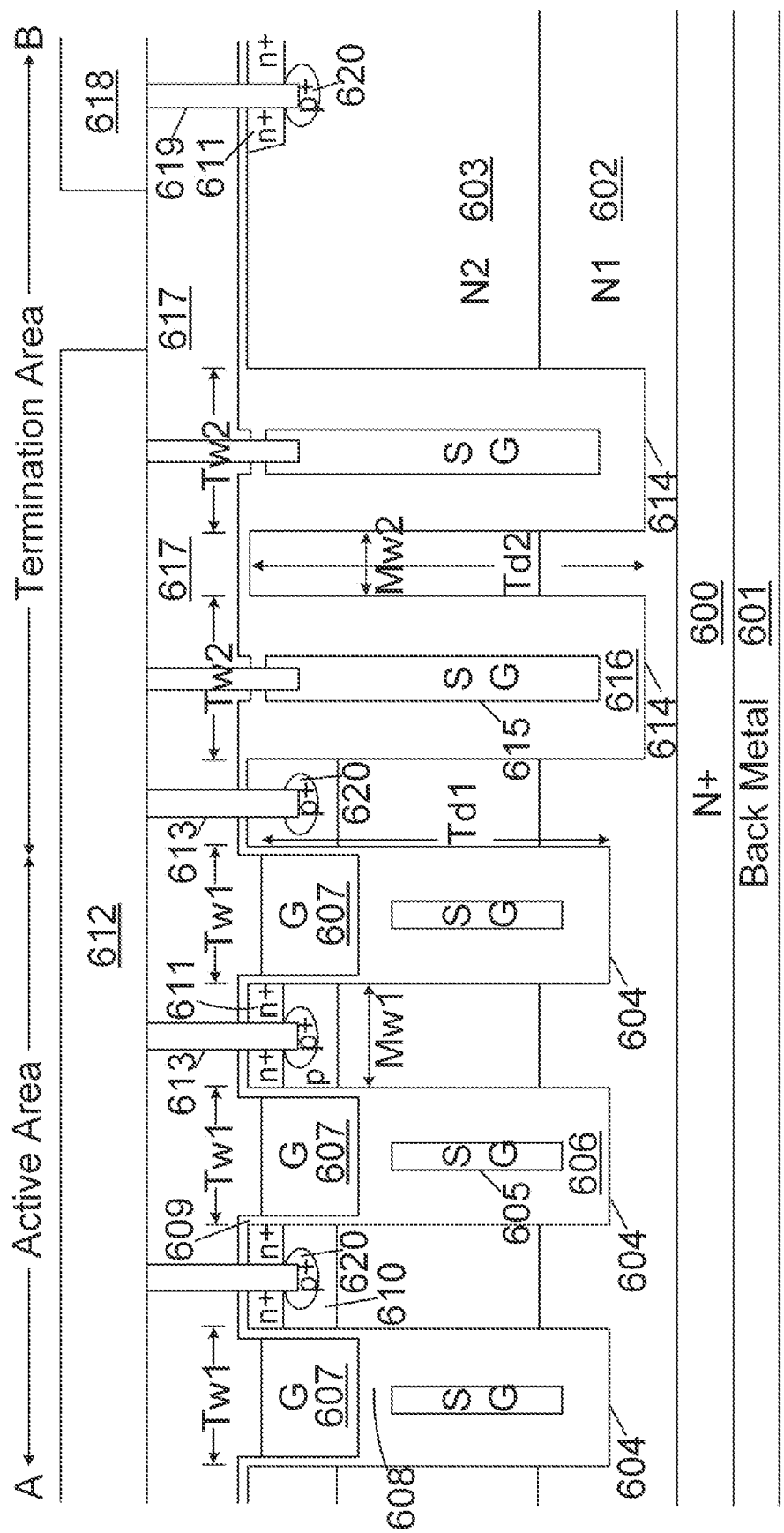
FIG. 6 is a cross-sectional view showing another preferred A-B cross section of FIG. 2B according to the present invention.

Please refer to FIG. 6 for another A-B cross-sectional view of FIG. 2B, wherein the preferred embodiment of this invention comprises active area and a termination area with two stepped epitaxial layers. The SGT trenched semiconductor power device has a similar structure FIG. 5, except that, in FIG. 6, the N type epitaxial layer comprises two stepped epitaxial layers of different doping concentrations including a bottom $1^{st}$ epitaxial layer (N1, as illustrated) 602 with a doping concentration D1 and a top 2nd epitaxial layer (N2, as illustrated) 603 above the bottom $1^{st}$ epitaxial layer 602 with a doping concentration D2, wherein D2<D1 to further reduce the specific on-resistance.

Figure 7:
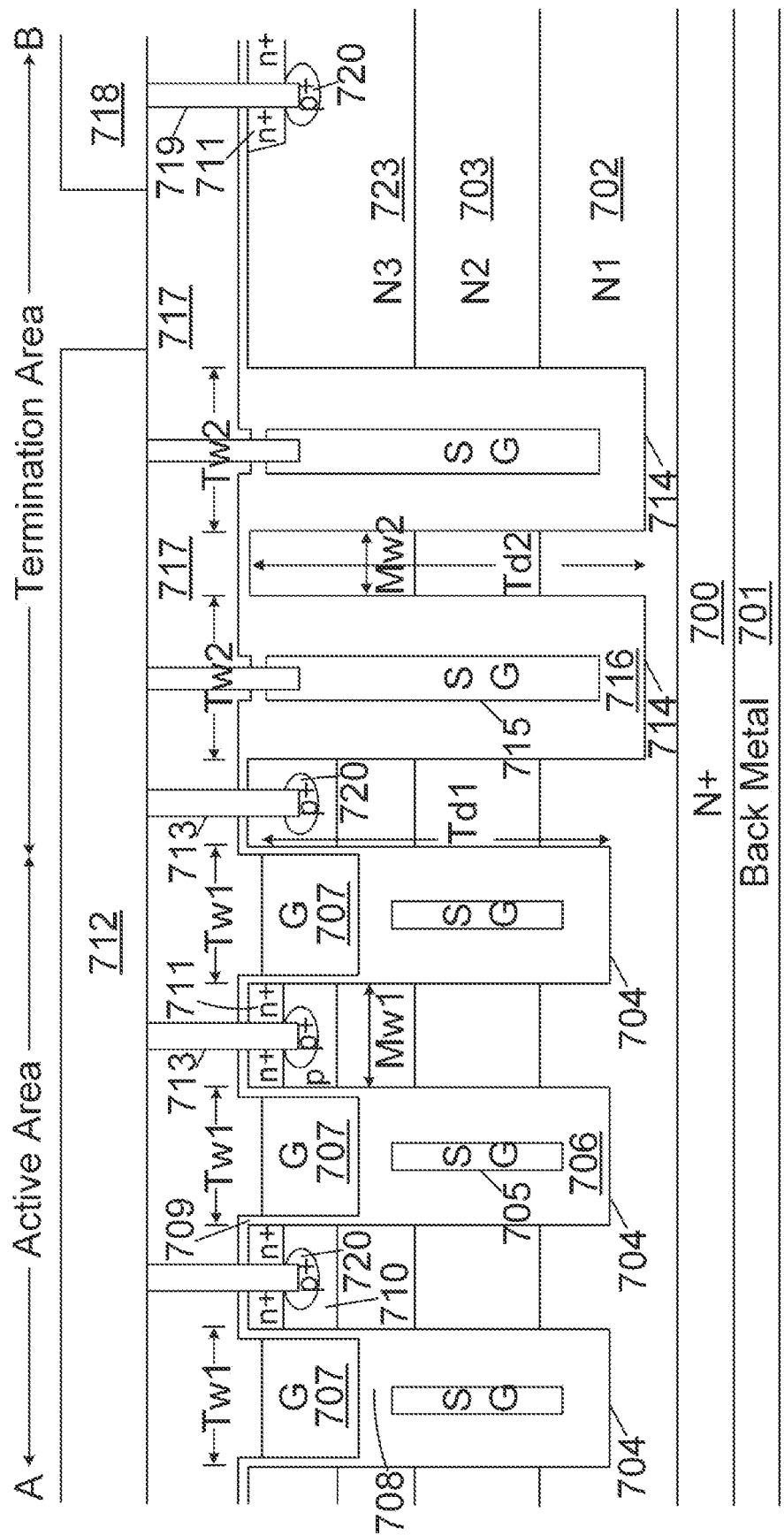
FIG. 7 is a cross-sectional view showing another preferred A-B cross section of FIG. 2B according to the present invention.

Please refer to FIG. 7 for another A-B cross-sectional view of FIG. 2B, wherein the preferred embodiment of this invention comprises an active area and a termination area with three stepped epitaxial layers. The SGT trenched semiconductor power device has a similar stricture to FIG. 5, except that, in FIG. 7, the N type epitaxial layer has three stepped epitaxial layers with doping concentrations decreasing stepwise in a direction from bottoms of the plurality of gate trenches toward the first type body regions along sidewalk of the gate trenches, including a bottom $1^{st}$ epitaxial layer (N1, as illustrated) 702 with a doping concentration D1, a middle $2^{nd}$ epitaxial layer (N2, as illustrated) 703 with a doping concentration D2 and a top $3^{rd}$ epitaxial layer (N3, as illustrated) 723 with a doping concentration D3, wherein D3<D2<D1, to further reduce the specific on-resistance. The D2 can be an average of D1 and D3.

Figure 8:
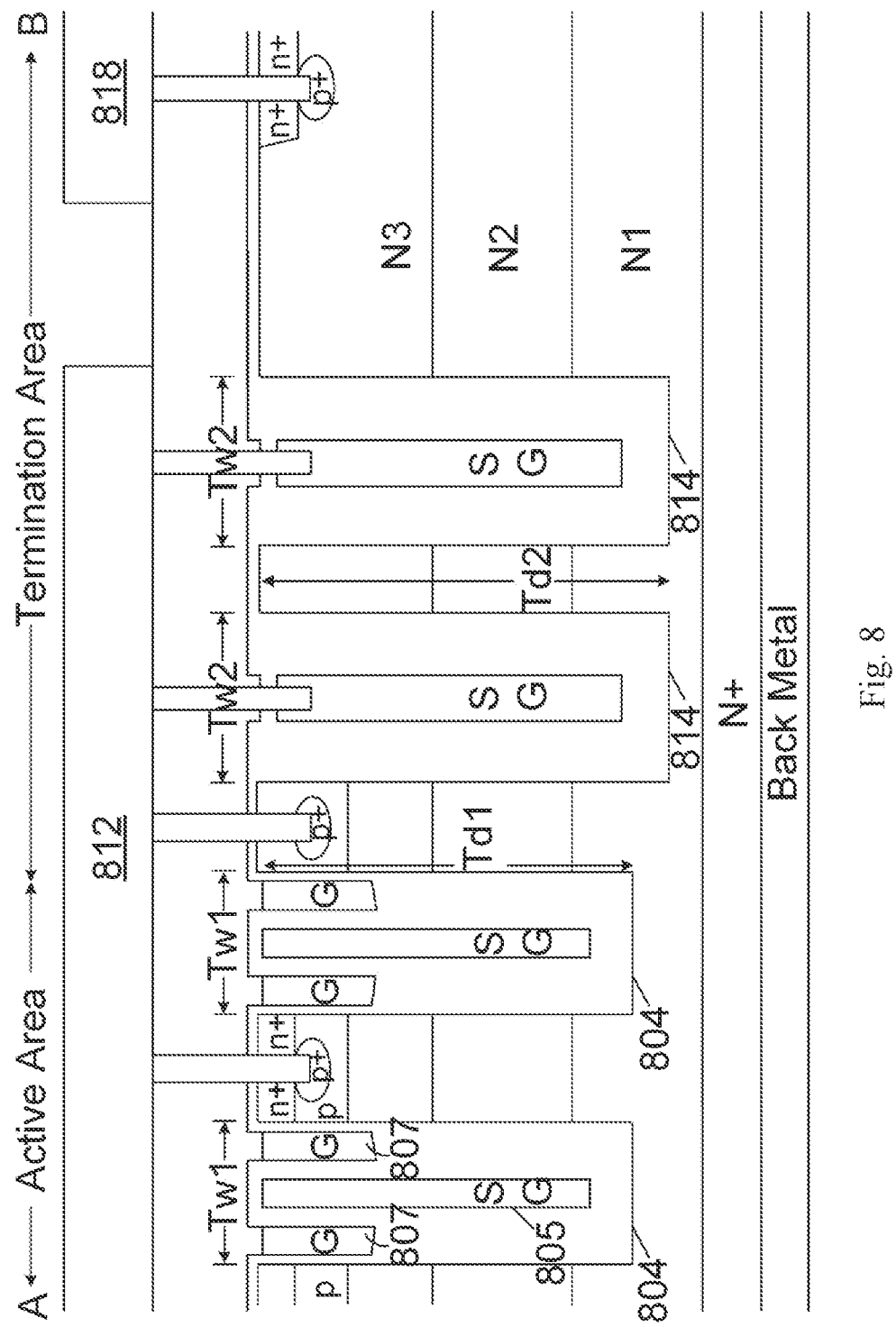
FIG. 8 is a cross-sectional view showing another preferred A-B cross section of FIG. 2B according to the present invention.

Please refer to FIG. 8 for another A-B cross-sectional view of FIG. 2B, wherein the preferred embodiment of this invention comprises an active area and a termination area with three stepped epitaxial layers. The SGT trenched semiconductor power device has a similar structure to FIG. 7, except for the different shielded gate structure in the gate trenches 804 in the active area. Inside each of the gate trenches 804, a shielded gate electrode (SG, as illustrated) 805 is disposed in the middle and gate electrode (G, as illustrated) 807 is disposed surrounding upper portions of the shielded electrode 805.

Figure 9:
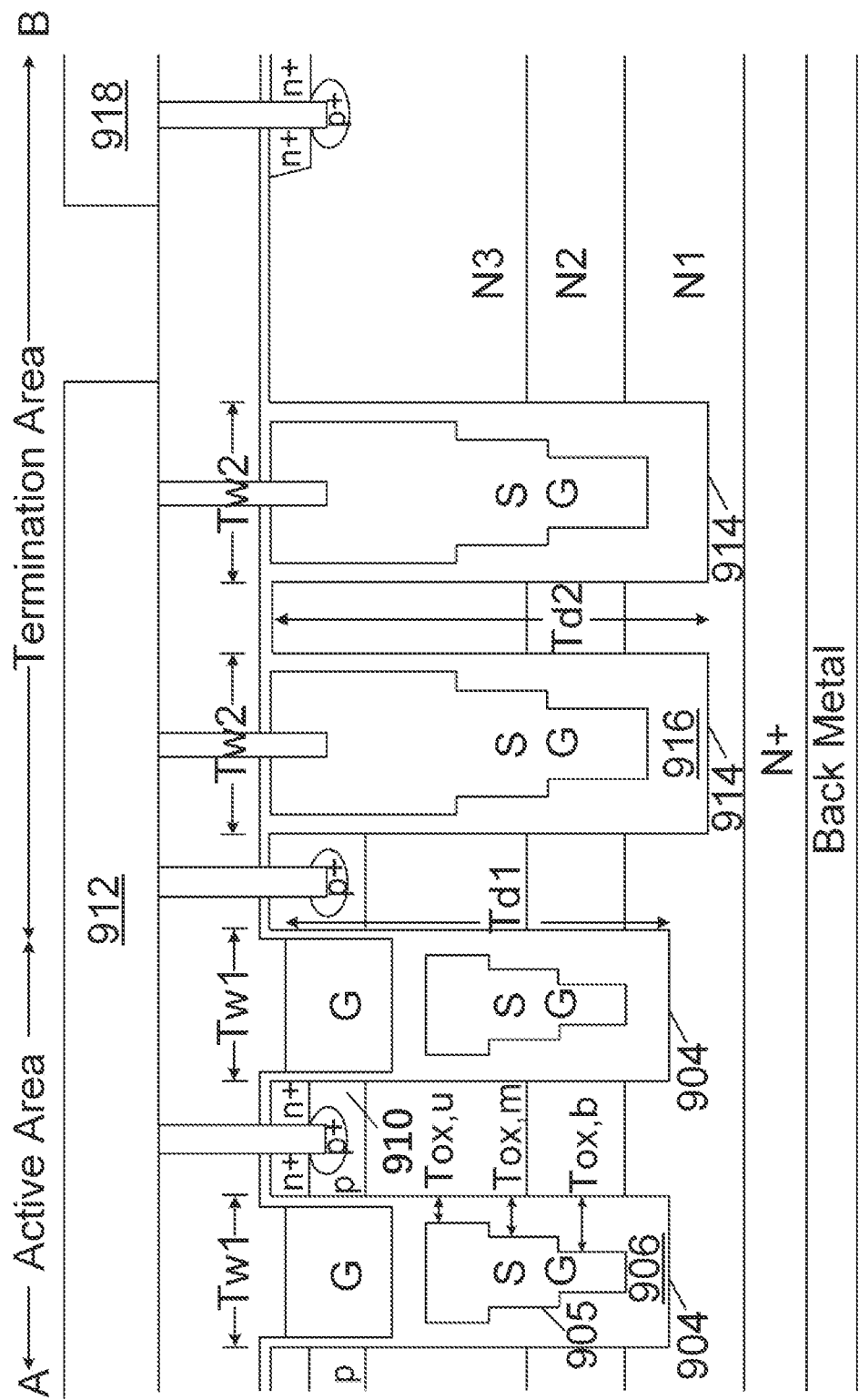
FIG. 9 is a cross-sectional view showing another preferred A-B cross section of FIG. 2B according to the present invention.

Please refer to FIG. 9 for another A-B cross-sectional view of FIG. 2B, wherein the preferred embodiment of this invention comprises an active area and a termination area with three stepped epitaxial layers. The N-channel trenched semiconductor power device has a similar structure to FIG. 7, except that the first insulating film has a multiple stepped oxide structure with thickness decreasing stepwise in a direction from bottoms of said gate trenches 904 toward the body regions 910 along sidewalls of said gate trenches 904. In FIG. 9, the first insulating film 906 in a single gate trench 904 has three stepped oxide structure having a lower portion oxide along lower portion sidewalk and bottom of the gate trenches 904 with a uniform first thickness Tox,b, a middle portion oxide with a uniform second thickness Tox,m, and an upper portion oxide with a uniform third thickness Tox,u, where Tox,b is greater than Tox,m, and Tox,m is greater than Tox,u, to further reduce the on-resistance while maintaining the same breakdown voltage. The Tox,m can be an average of Tox,b and Tox,u. Moreover, the second insulating film 916 in a single edge trench 914 has similar three stepped oxide structure as the first insulating film 906.

Please refer to FIG. 10A for a simplified top view of another preferred embodiment for a SGT semiconductor power device according to the present invention. The SGT semiconductor power device comprises an active area, a termination area, a gate metal pad area 1037, a central shielded gate trench contact row area 1035, a top long gate metal runner 1027, a bottom long gate metal runner 1028 and a short gate metal runner area 1029 above the gate metal pad area.

Figure 10B:
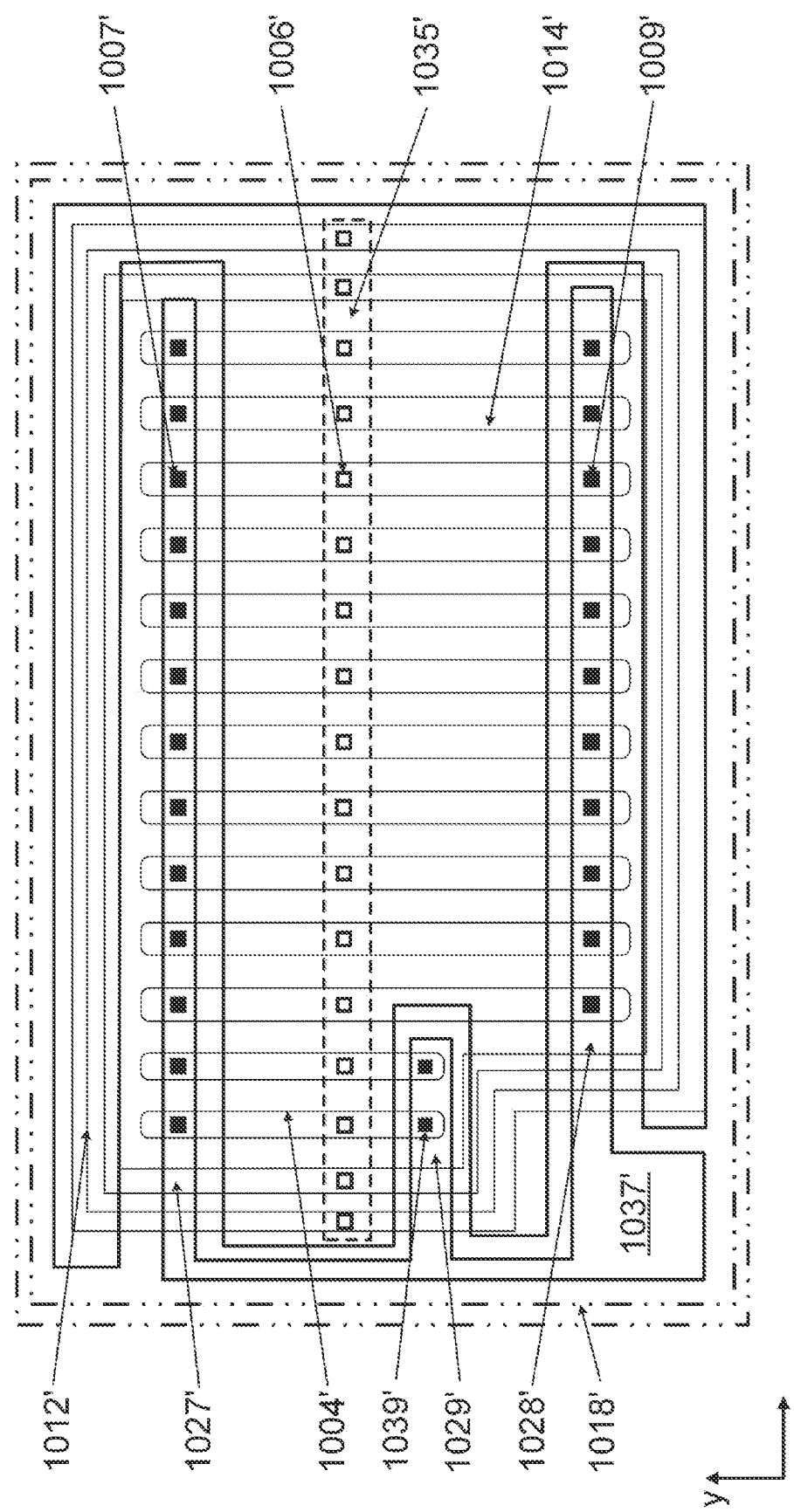
FIG. 10B is a detailed top view of the preferred embodiment for a SGT MOSFET of FIG. 10A according to the present invention.

Please refer to FIG. 10B for a detailed top view of the preferred embodiment for a SGT MOSFET of FIG. 10A according to the present invention, wherein the SGT semiconductor power device comprises an active area, a termination area, a gate metal pad area 1037', a central shielded gate trench contact row area 1035', a top long gate metal runner 1027', a bottom long gate metal runner 1028' and a short gate metal runner area 1029' above the gate metal pad area. The N-channel trenched semiconductor power device has a similar structure to FIG. 2B, except that, the different multiple gate metal runners 1027', 1028' and 1029' are all along the second axis (the x reference direction), and the central shielded gate contact row area 1035' locates in the vicinity of a center of the source metal 1012' along the second axis (the x reference direction). On each of the first type active trenches 1014', a top gate trench contact 1007', a bottom gate trench contact 1009' and one shielded gate trench contact 1006' in the middle of the source metal 1012' are formed while on each of the second type active trenches 1004', a top gate trench contact 1007', a bottom gate trench contact 1039' and one shielded gate trench contact 1006' in the vicinity of the bottom gate trench contact 1039' are formed. The shielded gate electrode inside each of the gate trenches is connected to the source metal 1012' through a shielded gate trench contact 1006' on each of the plurality of gate trenches 1014' and 1004' in the central shielded gate contact row area 1035' along a second axis (the x reference axis), and the shielded gate trench contact 1006' is spaced apart from each of the multiple gate metal runners with a distance larger than 100 μm.

Figure 11:
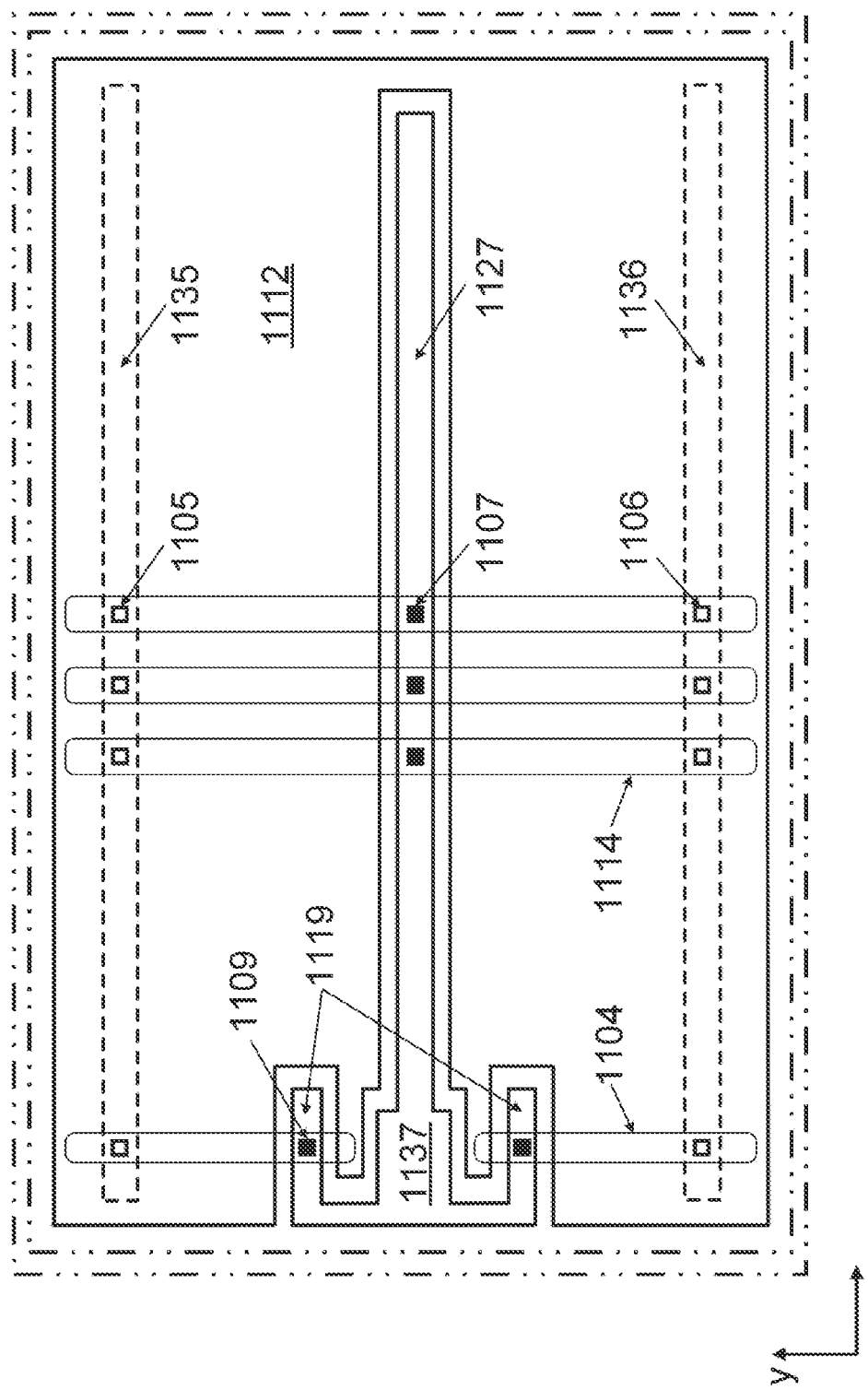
FIG. 11 is a top view showing another preferred embodiment for a SGT MOSFET according to the present invention.

Please refer to FIG. 11 for a top view of the preferred embodiment for a SGT MOSFET according to the present invention, wherein the SGT semiconductor power device comprises an active area, a termination area, a gate metal pad area 1137, a central long gate metal runner 1127 disposed in the middle region of the active area, two short gate metal runners 1119 above and below the gate metal pad area, a top shielded gate trench contact row area 1135 and a bottom shielded gate trench contact row area 1136. In the active area, a plurality of the first type gate trenches 1114 and the second type gate trenches 1104 are formed in the N type epitaxial layer onto a N+ substrate, wherein the length of the first type trench 1114 is longer than the second type trench 1104. Gate electrode inside each of the gate trenches 1114 and 1104 is connected to the gate metal pad area 1137 through the multiple gate metal runners 1127 and 1119 having a plurality of gate trench contacts 1107 and 1109 underneath, respectively. The shielded gate electrode inside each of the gate trenches 1114 and 1104 is connected to a source metal 1112 through shielded gate trench contacts 1105 and 1106 located in the top and bottom shielded gate contact row area 1135 and 1136 along a second axis (the x reference axis) which are spaced apart from any of the multiple gate metal runners 1107 and 1109 with a minimum distance larger than 100 μm.

Figure 12:
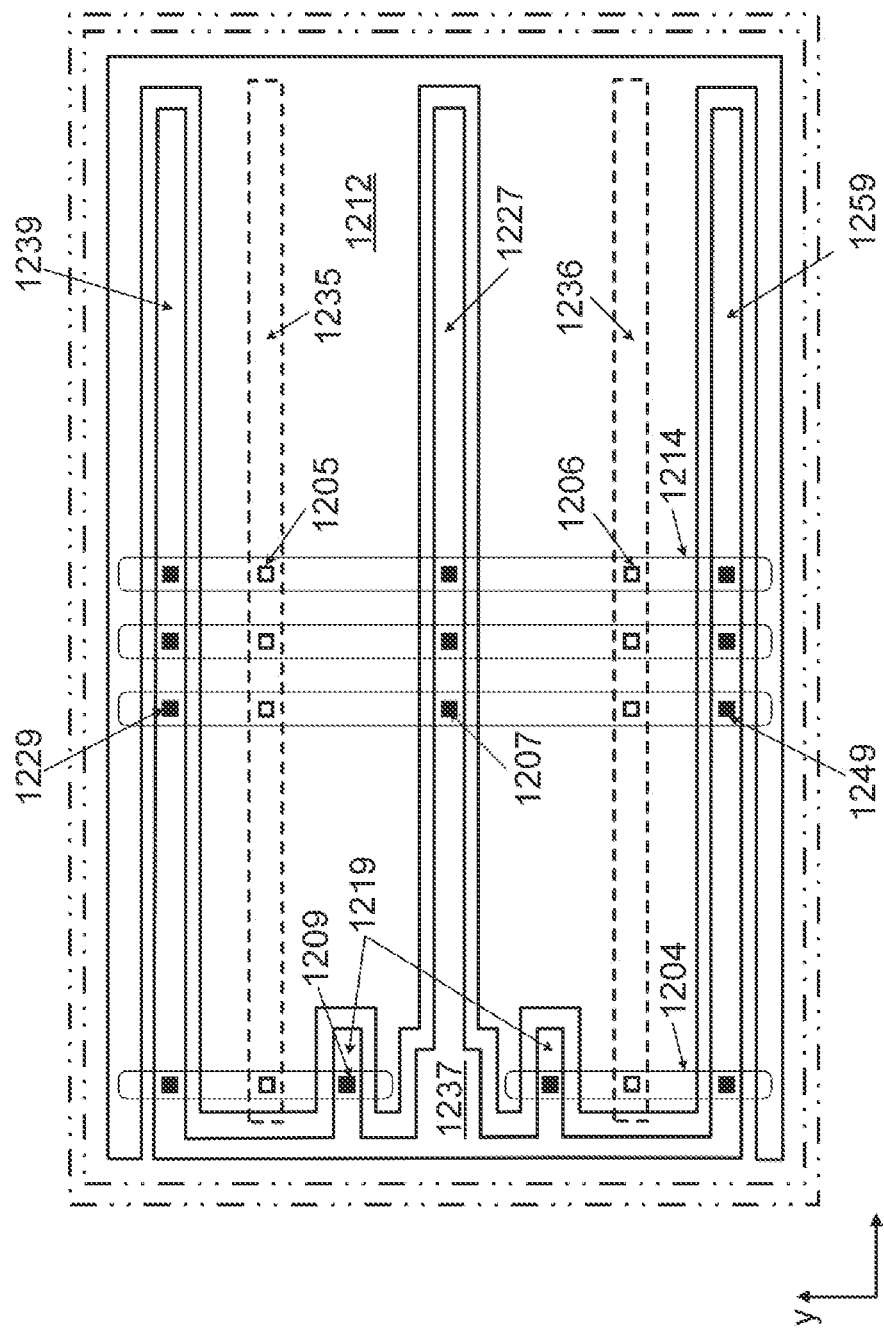
FIG. 12 is a top view showing another preferred embodiment for a SGT MOSFET according to the present invention.

Please refer to FIG. 12 for a top view of the preferred embodiment for a SGT MOSFET according to the present invention, wherein the SGT semiconductor power device comprises an active area, a termination area, a gate metal pad area 1237, a top long gate metal runner 1239, a middle long gate metal runner 1227, a bottom long gate metal runner 1259, two short gate metal runners 1219 above and below the gate metal pad area, a top shielded gate trench contact row area 1235 and a bottom shielded gate trench contact row area 1236. In the active area, a plurality of the first type gate trenches 1214 and the second type gate trenches 1204 are formed in the N type epitaxial layer onto a N+ substrate, wherein the length of the first type trench 1214 is longer than the second type trench 1204. Gate electrode inside each of the gate trenches 1214 and 1204 is connected to the gate metal pad area 1237 through the multiple gate metal runners 1239, 1227, 1259 and 1219 having a plurality of gate trench contacts 1229, 1207, 1249 and 1209 underneath, respectively. The shielded gate electrode inside each of the gate trenches 1214 and 1204 is connected to a source metal 1212 through shielded gate trench contacts 1205 and 1206 located in the top and bottom shielded gate contact row area 1235 and 1236 along a second axis (the x reference axis).

Figure 13:
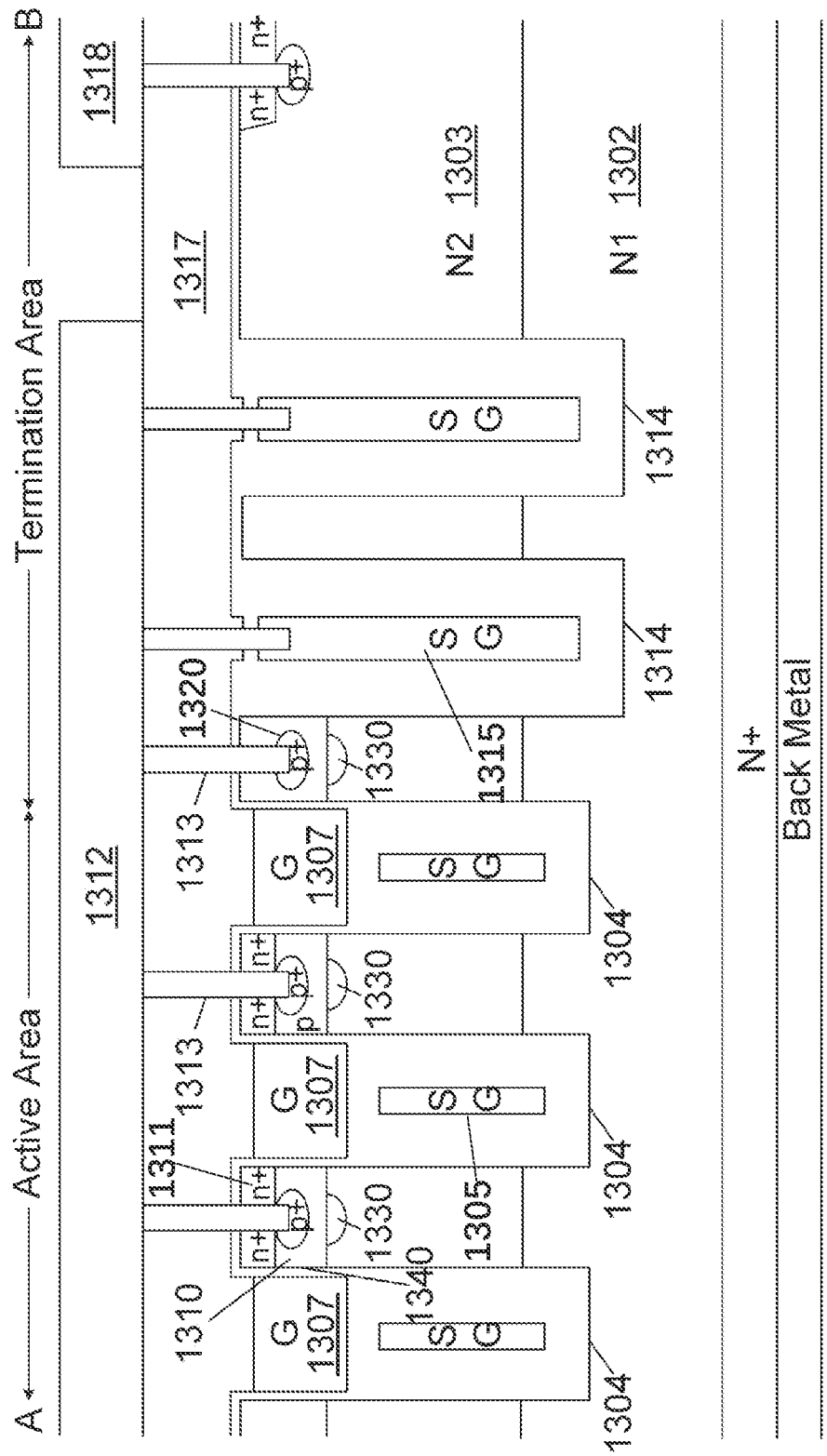
FIG. 13 is a cross-sectional view showing another preferred A-B cross section of FIG. 2B according to the present invention.

Please refer to FIG. 13 for another A-B cross-sectional view of FIG. 2B, wherein the preferred embodiment of this invention comprises an active area and a termination area with two stepped epitaxial layers. The SGT trenched semiconductor power device has a similar structure to FIG. 6, except that, in FIG. 13, a P type source breakdown voltage holding region 1330 is formed between two adjacent gate trenches 1304 adjoining lower surfaces of the body region 1310 and is spaced apart from the adjacent gate trenches 1304. The P type source breakdown voltage holding region 1330 shields a PN junction between the P body region 1310 and the top epitaxial layer 1303 (N2, as illustrated) near the channel region 1340 from avalanche breakdown for avalanche capability improvement. The P type source breakdown voltage holding region 1330 is formed by a boron ion implantation through the trenched source-body contact 1313.

Figure 14:
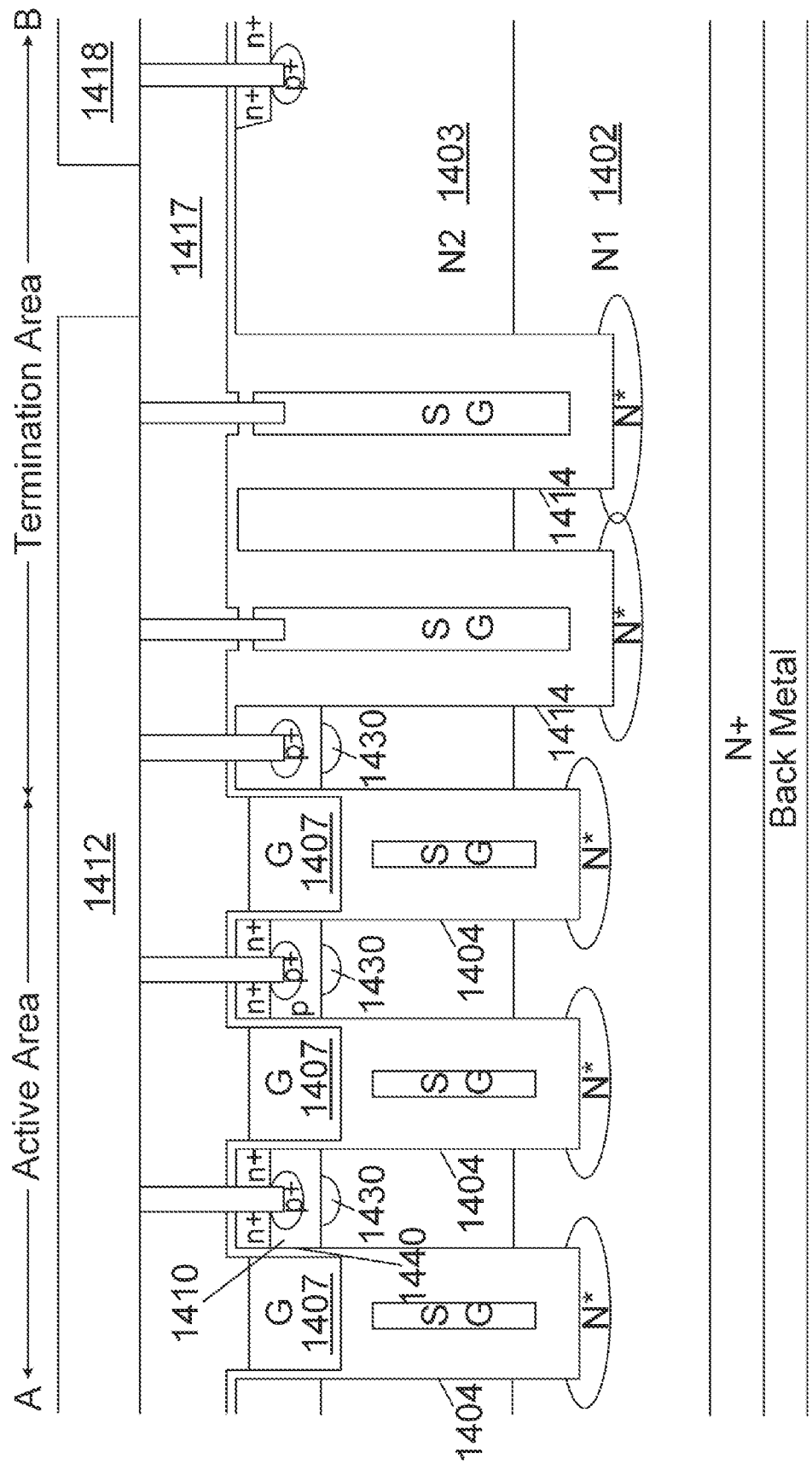
FIG. 14 is a cross-sectional view showing another preferred A-B cross section of FIG. 2B according to the present invention.

Please refer to FIG. 14 for another A-B cross-sectional view of FIG. 2B, wherein the preferred embodiment of this invention comprises an active area and a termination area with two stepped epitaxial layers. The SGT trenched semiconductor power device has a similar structure to FIG. 13, except that, the invention in FIG. 14 further comprises an N type electric field reducing region N* with a doping concentration D* disposed surrounding a bottom of each of the gate trenches 1404 in the active area and the edge trenches 1414 in the termination area, wherein the doping concentration D* is lower than the doping concentration D1 of the bottom $1^{st}$ epitaxial layer 1402 (N1, as illustrated) for breakdown voltage enhancement. The N type electric field reducing region is formed by boron ion implant through bottoms of the gate trenches 1404 and edge trenches 1414.

Figure 15:
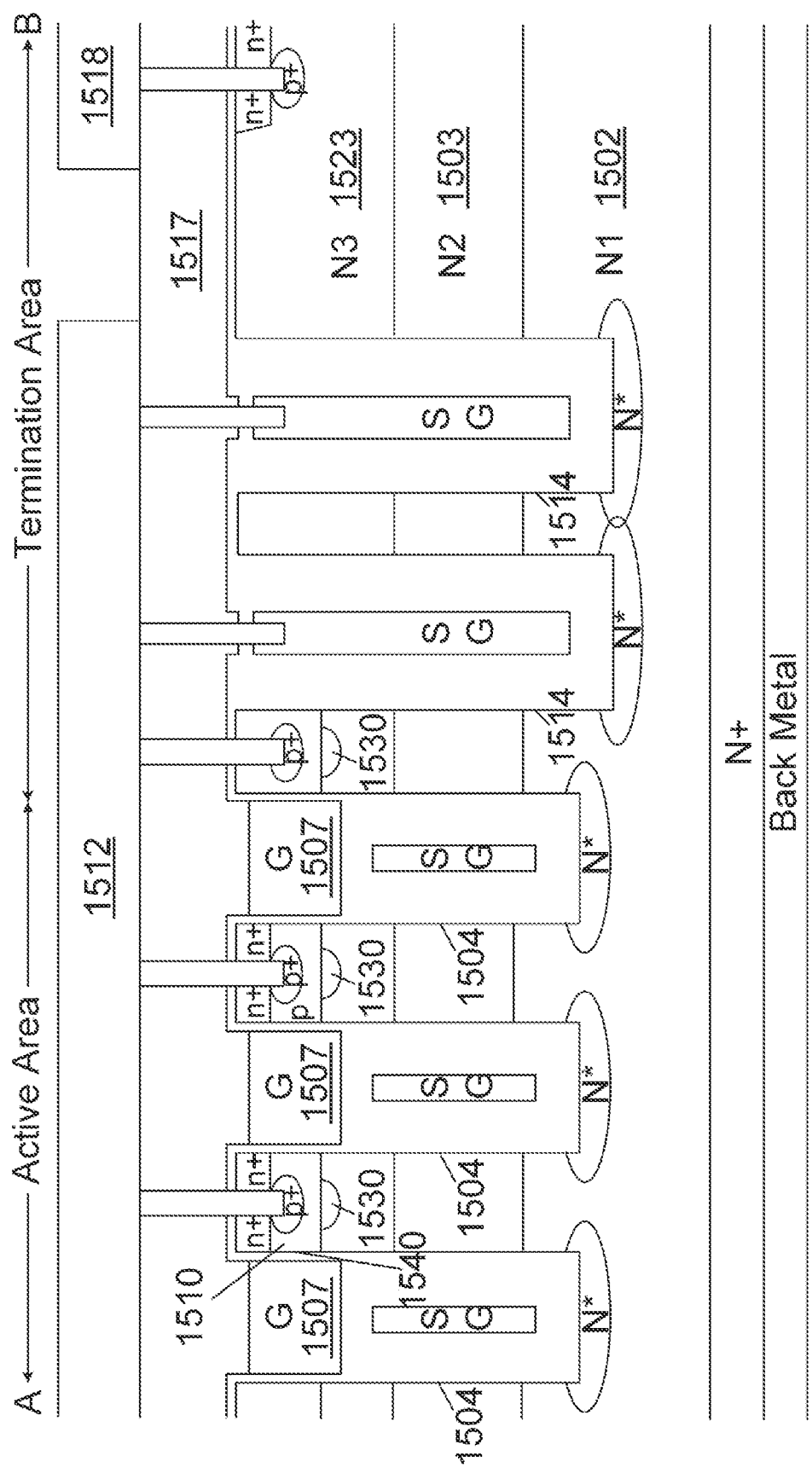
FIG. 15 is a cross-sectional view showing another preferred A-B cross section of FIG. 2B according to the present invention.

Please refer to FIG. 15 for another A-B cross-sectional view of FIG. 2B, wherein the preferred embodiment of this invention comprises an active area and a termination area with three epitaxial layers. The SGT trenched semiconductor power device has a similar structure to FIG. 14 except that, in FIG. 15, the N type epitaxial layer has three stepped epitaxial layers with different doping concentrations decreasing stepwise in a direction from bottoms of the plurality of gate trenches toward the first type body regions along sidewalls of the gate trenches, including a bottom $1^{st}$ epitaxial layer (N1, as illustrated) 1502 with a doping concentration D1, a middle $2^{nd}$ epitaxial layer (N2, as illustrated) 1503 with a doping concentration D2 and a top $3^{rd}$ epitaxial layer (N3, as illustrated) 1523 with a doping concentration D3, wherein D3<D2<D1, to further reduce the specific on-resistance. The D2 can be an average of D1 and D3.

Figure 16:
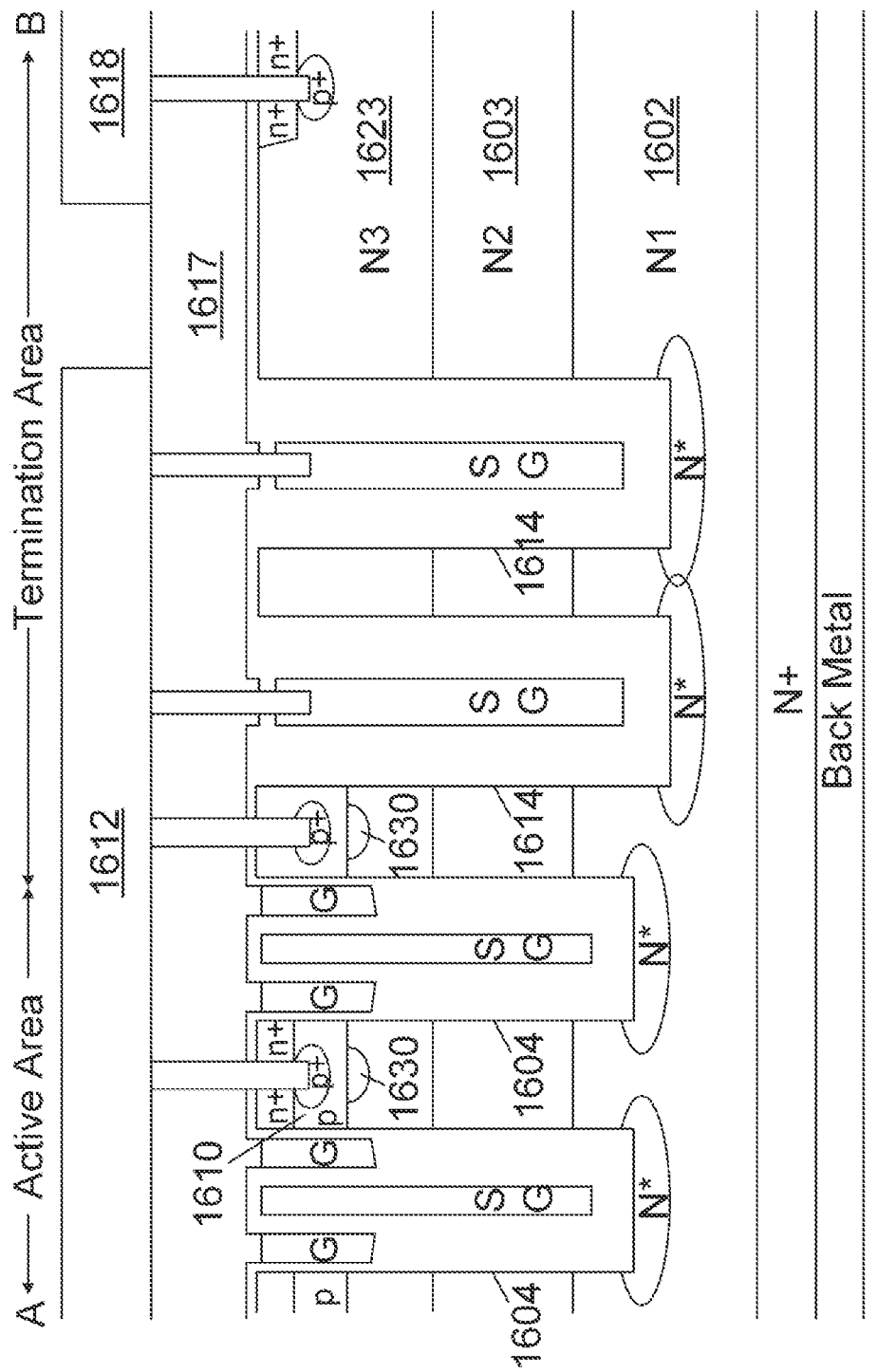
FIG. 16 is a cross-sectional view showing another preferred A-B cross section of FIG. 2B according to the present invention.

Please refer to FIG. 16 for another A-B cross-sectional view of FIG. 2B, wherein the preferred embodiment of this invention comprises an active area and a termination area with three stepped epitaxial layers. The SGT trenched semiconductor power device has a similar structure to FIG. 8, except that, in FIG. 16, a P type source breakdown voltage holding region 1630 is formed between two adjacent gate trenches 1604 adjoining lower surfaces of the body region 1610 and is spaced apart from the adjacent gate trenches 1604. Besides, an N type electric field reducing region N* with a doping concentration D* is disposed surrounding a bottom of each of the gate trenches 1604 in the active area and the edge trenches 1614 in the termination area, wherein the doping concentration D* is lower than the doping concentration D1 of the bottom $1^{st}$ epitaxial layer 1602 (N1, as illustrated) for breakdown voltage enhancement. The N type electric field reducing region is formed by boron ion implant through bottoms of the gate trenches 1604 and edge trenches 1614.

Figure 17:
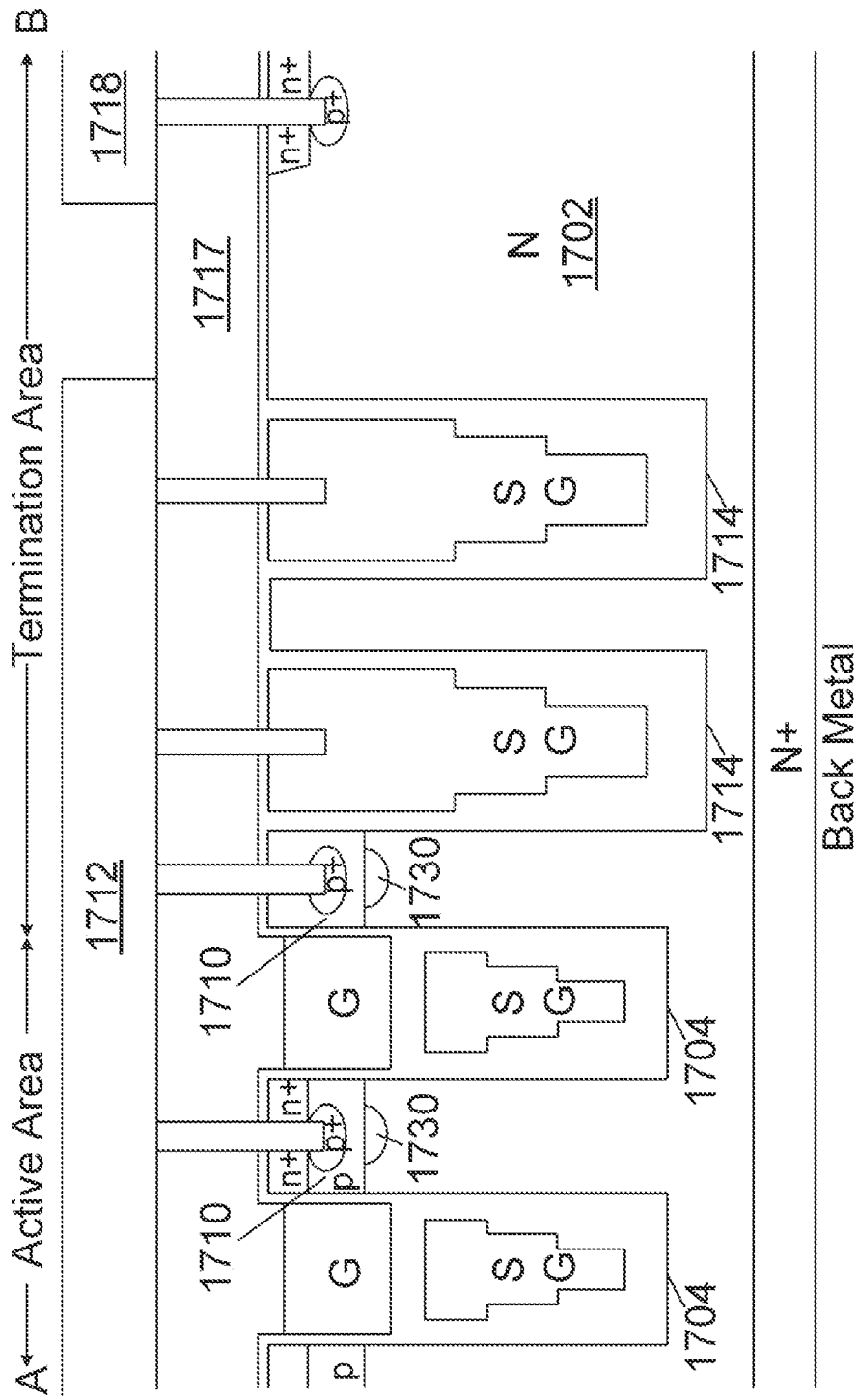
FIG. 17 is a cross-sectional view showing another preferred A-B cross section of FIG. 2B according to the present invention.

Please refer to FIG. 17 for another A-B cross-sectional view of FIG. 2B wherein the preferred embodiment of this invention comprises an active area and a termination area with a single N type epitaxial layer 1702 with a uniform doping concentration. The SGT trenched semiconductor power device has a similar structure to FIG. 9, except that, in FIG. 17, a P type source breakdown voltage holding region 1730 is formed between two adjacent gate trenches 1704 adjoining lower surfaces of the body regions 1710 and is spaced apart from the adjacent gate trenches 1704 for avalanche capability enhancement.

Although the present invention has been described in terms of the presently preferred embodiments, it is to be understood that such disclosure is not to be interpreted as limiting. The embodiments described above often show N-channel devices, the embodiments can also be applied to P-channels devices by reversing the polarities of the conductivity types. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A shielded gate trench (SGT) device comprising:
an active area, a termination area, a gate metal pad area, a central gate metal runner and at least one shielded gate trench contact row area;
said active area comprising a plurality of gate trenches formed in an epitaxial layer of a first conductivity type onto a substrate of said first conductivity type along a first axis including a first type active trenches having a first active trench length, and a second type active trenches near the said gate metal pad area having a second active trench length, wherein said first active trench length is longer than the second active trench length;
said termination area comprising at least one first termination trench surrounding outer periphery of said plurality of gate trenches in a first direction along said first axis and in a second direction along a second axis wherein said first axis is vertical to said second axis, and said at least one first type termination trench is separated from said plurality of gate trenches and does not surround said gate metal pad area;

said plurality of gate trenches are formed in said active area, surrounded by a first type source regions of said first conductivity type encompassed in a first type body regions of a second conductivity type near a top surface of said epitaxial layer of said first conductivity type, each of said plurality of gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film;

said gate electrode inside each of said gate trenches is connected to said gate metal pad area through said central gate metal runner having a plurality of gate trench contacts underneath;

said shielded gate electrode inside each of said gate trenches is connected to a source metal through at least one shielded gate trench contact on each of said plurality of gate trenches, said at least one shielded gate trench contact locates in said at least one shielded gate contact row area along said second axis, and said at least one shield gate trench contact is spaced apart from said gate metal runner with a distance larger than 100 μm, and said central gate metal runner is disposed in the vicinity of the middle of said source metal.

2. The SGT device of claim 1, wherein said epitaxial layer has multiple stepped epitaxial layers with doping concentrations decreasing stepwise in a direction from bottoms of said plurality of gate trenches toward said first type body regions along sidewalls of said gate trenches.

3. The SGT device of claim 1, further comprising a channel stop region in said termination area with a second type source regions of said first conductivity type shorted with said epitaxial layer underneath a channel stop metal, and said none of said first type body regions exists between two adjacent said termination trenches.

4. The SGT device of claim 1, wherein said gate electrode is disposed above said shielded gate electrode inside each of said plurality of gate trenches.

5. The SGT device of claim 1, wherein said shielded electrode is disposed in the middle of each of said plurality of gate trenches, and said gate electrode is disposed surrounding upper portion of said shielded electrode.

6. The SGT device of claim 1, wherein said first insulating film is a single oxide film having a uniform thickness along sidewalls of said plurality of gate trenches.

7. The SGT device of claim 1, wherein said first insulating film has multiple stepped oxide structure with thickness decreasing stepwise in a direction from bottoms of said gate trenches toward said body regions along sidewalls of said gate trenches.

8. The SGT device of claim 1, further comprising two long shielded gate trench contact row areas in a top and a bottom of said source metal, and one short shielded gate trench contact row area above said gate metal pad area, wherein each of said plurality of gate trenches has two shielded gate trench contacts.

9. The SGT device of claim 1, further comprising one long shielded gate trench contact row area in a top of said source metal wherein each of said plurality of gate trenches has one shielded gate trench contact.

10. The SGT device of claim 1, further comprising one long shielded gate trench contact row area in a bottom of said source metal and one short shielded gate trench contact row area above said gate metal pad area, wherein each of said plurality of gate trenches has one shielded gate trench contact.

11. A shielded gate trench (SGT) device comprising:
an active area, a gate metal pad area and multiple metal runners;
said active area comprising a plurality of gate trenches formed in an epitaxial layer of a first conductivity type onto a substrate of said first conductivity type;
said plurality of gate trenches are formed in said active area, surrounded by a first type source regions of said first conductivity type encompassed in a first type body regions of a second conductivity type near a top surface of said epitaxial layer of said first conductivity type, each of said gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film;
said gate electrode inside each of said gate trenches is connected to said gate metal pad area through said multiple gate metal runners having a plurality of gate trench contacts underneath;
said shielded gate electrode inside each of said gate trenches is connected to a source metal through at least one shielded gate trench contact which is spaced apart from any of said multiple gate metal runners with a distance larger than 100 μm.

12. The SGT device of claim 11, said multiple gate metal runners have one long gate metal runner disposed in the middle region of said active area, and two short gate metal runners disposed above and below said gate metal pad area, respectively.

13. The SGT device of claim 12, further comprising two shielded gate trench contact row regions in a top and a bottom of said source metal wherein each of said plurality of gate trenches has said at least one shielded gate trench contact.

14. The SGT device of claim 11, said multiple gate metal runners have three long gate metal runners disposed in top, middle and bottom regions of said active area, and two short gate metal runners disposed above and below said gate metal pad area, respectively.

15. The SGT device of claim 11, further comprising two shielded gate trench contact row areas among said multiple gate metal runners wherein each of said plurality of gate trenches has at least one shielded gate trench contact.

16. A shielded gate trench (SGT) device comprising:
an active area, a gate metal pad area and at least one gate metal runner;
said active area comprising a plurality of gate trenches formed in an epitaxial layer of a first conductivity type onto a substrate of said first conductivity type;
said epitaxial layer has multiple stepped epitaxial layers with different doping concentrations;
said plurality of gate trenches are formed in said active area, surrounded by source regions of a said first conductivity type encompassed in body regions of a second conductivity type near a top surface of an said epitaxial layer of said first conductivity type, each of said gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film;

said gate electrode inside each of said plurality of gate trenches is connected to said gate metal pad area through said at least one metal runners having a plurality of gate trench contacts underneath;

said shielded gate electrode inside each of said gate trenches is connected to a source metal through at least one shielded gate trench contact which is spaced apart from said at least one gate metal runner with a distance larger than 100 μm; and a source breakdown voltage holding region of said second type conductivity adjoins each of lower surfaces of said body regions and is spaced apart from adjacent said plurality of gate trenches.

17. The SGT device of claim 16, further comprising an electric field reducing region of said first conductivity type surrounding each bottom of said plurality of gate trenches with a doping concentration lower than first epitaxial layer of said multiple stepped epitaxial layers on said substrate.

18. The SGT device of claim 16, wherein each of said multiple stepped epitaxial layers has a doping concentration decreasing stepwise in a direction from bottoms of said plurality of gate trenches toward said body regions along sidewalls of said gate trenches.

19. The SGT device of claim 16, wherein said gate electrode is disposed above said shielded gate electrode inside each of said plurality of gate trenches.

20. The SGT device of claim 16, wherein said shielded electrode is disposed in the middle of each of said plurality of gate trenches, and said gate electrode is disposed surrounding upper portion of said shielded electrode.

* * * * *